United States Patent
Seo

(10) Patent No.: US 9,076,514 B2
(45) Date of Patent: Jul. 7, 2015

(54) METHODS OF COPYING A PAGE IN A MEMORY DEVICE AND METHODS OF MANAGING PAGES IN A MEMORY SYSTEM

(71) Applicant: Samsung Electronics Co., Ltd., Suwon-si (KR)

(72) Inventor: Seong-Young Seo, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/054,784

(22) Filed: Oct. 15, 2013

(65) Prior Publication Data
US 2014/0185395 A1    Jul. 3, 2014

(30) Foreign Application Priority Data
Jan. 3, 2013 (KR) .................. 10-2013-0000439

(51) Int. Cl.
G11C 7/10 (2006.01)
G11C 7/12 (2006.01)
G11C 7/22 (2006.01)

(52) U.S. Cl.
CPC ............ *G11C 7/22* (2013.01); *G11C 7/1048* (2013.01); *G11C 7/1051* (2013.01); *G11C 7/10* (2013.01); *G11C 2207/2236* (2013.01)

(58) Field of Classification Search
CPC ....... G11C 7/1051; G11C 7/10; G11C 7/1048
USPC ........................... 365/185.12, 189.17, 230.03
See application file for complete search history.

(56) References Cited

U.S. PATENT DOCUMENTS

| | | | |
|---|---|---|---|
| 5,426,603 A * | 6/1995 | Nakamura et al. | 365/149 |
| 5,625,601 A | 4/1997 | Gillingham et al. | |
| 6,598,143 B1 | 7/2003 | Baker et al. | |
| 7,254,075 B2 * | 8/2007 | Woo et al. | 365/207 |
| 7,596,027 B2 | 9/2009 | Kawai et al. | |
| 8,180,994 B2 * | 5/2012 | Sprouse et al. | 711/202 |
| 2006/0239073 A1 * | 10/2006 | Toda | 365/185.03 |
| 2007/0115724 A1 * | 5/2007 | Hwang | 365/185.17 |
| 2007/0180187 A1 | 8/2007 | Olson et al. | |
| 2008/0123423 A1 * | 5/2008 | Kim | 365/185.11 |

(Continued)

FOREIGN PATENT DOCUMENTS

| | | |
|---|---|---|
| JP | 2003-030993 | 1/2003 |
| JP | 2011-192343 | 9/2011 |
| KR | 10-1999-0080499 A | 11/1999 |

*Primary Examiner* — Ly D Pham
(74) *Attorney, Agent, or Firm* — Muir Patent Law, PLLC

(57) ABSTRACT

A method of copying a page in a memory device having a plurality of memory blocks and a plurality of sets of bit lines is disclosed, wherein each of the plurality of memory blocks includes a plurality of pages, and each set of bit lines corresponds to a respective memory block, wherein first bit lines of a source memory block that includes a source page are respectively coupled to second bit lines of a target memory block that includes a target page. The method includes disconnecting between the first bit lines of the source memory block including a source page and from the second bit lines of a the target memory block including a target page; transferring data stored in the source page to the first bit lines of the source memory block; transferring the data from the first bit lines of the source memory block to the second bit lines of the target memory block; and writing the data transferred to the second bit lines of the target memory block into the target page.

19 Claims, 21 Drawing Sheets

(56) References Cited

U.S. PATENT DOCUMENTS

2011/0225355 A1 9/2011 Kajigaya
2011/0249509 A1 10/2011 Arizono
2012/0124305 A1 5/2012 Weissman et al.

* cited by examiner

METHODS OF COPYING A PAGE IN A MEMORY DEVICE AND METHODS OF MANAGING PAGES IN A MEMORY SYSTEM

CROSS-REFERENCE TO RELATED APPLICATION(S)

This application claims priority under 35 USC §119 to Korean Patent Application No. 10-2013-0000439, filed on Jan. 3, 2013 in the Korean Intellectual Property Office (KIPO), the contents of which are herein incorporated by reference in their entirety.

BACKGROUND

1. Technical Field

This disclosure relates to a semiconductor device, and more particularly to a memory device and a memory system having the memory device.

2. Description of the Related Art

In general memory systems, a memory controller reads data stored in a source page of a memory device and then writes the data into a target page of the memory device to copy the data from the source page to the target page.

Therefore, due to the typical read and write steps, power consumption and time required to perform the page copy operation may be undesirably high.

SUMMARY

Some example embodiments are directed to provide a method of copying a page in a memory device.

Some example embodiments are directed to provide a method of managing pages in a memory system.

Other example embodiments are directed toward a system for copying pages in a memory device.

In one embodiment, a method of copying a page in a memory device having a plurality of memory blocks and a plurality of sets of bit lines is disclosed. Each of the plurality of memory blocks includes a plurality of pages, and each set of bit lines corresponds to a respective memory block, wherein first bit lines of a source memory block that includes a source page are respectively coupled to second bit lines of a target memory block that includes a target page. The method includes disconnecting the first bit lines of the source memory block from the bit lines of the target memory block; transferring data stored in the source page to the first bit lines of the source memory block; transferring the data from the first bit lines of the source memory block to the second bit lines of the target memory block; and writing the data transferred to the second bit lines of the target memory block into the target page.

In example embodiments, disconnecting the first bit lines of the source memory block from the second bit lines of the target memory block may include disconnecting between the first bit lines of the source memory block and bit lines of memory blocks adjacent to the source memory block.

In example embodiments, transferring the data stored in the source page to the first bit lines of the source memory block may include activating a word line of the source page and activating a sense amplifier of the source memory block to amplify voltages of the first bit lines of the source memory block.

In example embodiments, in the case that the target memory block is adjacent to the source memory block, transferring the data from the first bit lines of the source memory block to the secondbit lines of the target memory block may include disconnecting the second bit lines of the target memory block from bit lines of a memory block adjacent to the target memory block in an opposite direction of the source memory block, turning off an equalizer of the target memory block, and connecting between the first bit lines of the source memory block and the second bit lines of the target memory block.

Writing the data transferred to the second bit lines of the target memory block into the target page may include activating a word line of the target page.

The method of copying a page may further include precharging the first bit lines of the source memory block and the second bit lines of the target memory block after writing the data transferred to the bit lines of the target memory block into the target page and connecting the second bit lines of the target memory block to the first bit lines of the source memory block and to the bit lines of the memory block adjacent to the target memory block in the opposite direction of the source memory block.

In example embodiments, in the case that at least one memory block is located between the target memory block and the source memory block, transferring the data from the first bit lines of the source memory block to the second bit lines of the target memory block may include disconnecting the second bit lines of the target memory block from bit lines of a memory block adjacent to the target memory block in an opposite direction of the source memory block, turning off equalizers of memory blocks located between the target memory block and the source memory block and an equalizer of the target memory block, and connecting the first bit lines of the source memory block and bit lines of a memory block adjacent to the source memory block and in between the source memory black and the target memory block.

Writing the data transferred to the second bit lines of the target memory block into the target page may include activating a word line of the target page, disconnecting the second bit lines of the target memory block from the bit lines of the memory block adjacent to the target memory block and in between the source memory block and the target memory block, precharging bit lines of memory blocks, which are located between the target memory block and the source memory block and are not adjacent to the target memory block, and precharging the first bit lines of the source memory block, activating a sense amplifier of the target memory block to amplify voltages of the second bit lines of the target memory block, and activating the word line of the target page.

The method of copying a page may further include precharging the second bit lines of the target memory block and the bit lines of the memory block adjacent to the target memory block and in between the source memory block and the target memory block after writing the data transferred to the second bit lines of the target memory block into the target page, and connecting between bit lines of adjacent memory blocks.

The method of copying a page may further include precharging bit lines of the plurality of memory blocks and connecting between bit lines of adjacent memory blocks before disconnecting between the first bit lines of the source memory block and the second bit lines of the target memory block.

In example embodiments, a connection between bit lines of adjacent memory blocks may be controlled by an isolation transistor that turns on in response to an isolation control signal.

In a method of managing pages in a memory system having a memory controller and a memory device, where the memory device includes a plurality of memory blocks, according to some example embodiments, the memory controller provides a page copy command, a source address and a target address to the memory device, and the memory device performs a page copy operation, which copies data stored in a source page corresponding to the source address to a target page corresponding to the target address through bit lines of a source memory block including the source page and bit lines of a target memory block including the target page, in response to the page copy command.

In example embodiments, copying the data stored in the source page to the target page may include disconnecting between the bit lines of the source memory block and the bit lines of the target memory block, transferring the data stored in the source page to the bit lines of the source memory block, connecting between the bit lines of the source memory block and the bit lines of the target memory block, transferring the data from the bit lines of the source memory block to the bit lines of the target memory block, and writing the data transferred to the bit lines of the target memory block into the target page.

In example embodiments, disconnecting includes opening a set of switches between the bit lines of the source memory block and the bit lines of the target memory block, and the connecting includes closing the set of switches between the bit lines of the source memory block and the bit lines of the target memory block In example embodiments, the memory device may finish the page copy operation in a predetermined time interval from a time at which the memory device receives the page copy command, the source address and the target address from the memory controller.

The method of managing pages in the memory system may further include selecting as the target memory block a memory block among the plurality of memory blocks in which a number of pages that store data is greater than a number of pages that do not store data, determining first through n-th target addresses corresponding to the pages that do not store data in the target memory block, where n is a positive integer, determining first through n-th source addresses corresponding to pages that store data in a memory block in which a number of the pages that store data is smaller than a number of pages that do not store data, providing the page copy command n-times together with a respective pair of a k-th source address and k-th target address consecutively in accordance with the predetermined time interval from the memory controller to the memory device, where k is a positive integer smaller than or equal to n, providing a refresh command for the target memory block from the memory controller to the memory device, and performing, in the memory device, a refresh operation, which refreshes pages included in the target memory block, in response to the refresh command.

In one embodiment, a memory system includes a controller and a memory device coupled to the controller. The memory device may include a plurality of blocks of memory cells including at least a first block and a second block having no blocks therebetween, each block of the plurality of blocks including a plurality of pages of memory cells, wherein the first block includes a first plurality of pages coupled to a plurality of first bit lines, and the second block includes a second plurality of pages coupled to a plurality of second bit lines; and a plurality of first switches coupled respectively between the plurality of first bit lines and the plurality of second bit lines. The controller is configured to copy data stored in a first page of the first plurality of pages to a second page of the second plurality of pages by controlling the plurality of first switches.

The controller may be configured to perform a procedure of opening and closing the plurality of first switches in order to copy the data stored in the first page to the second page.

The controller may be further configured to: open the plurality of first switches to disconnect the plurality of first bit lines from the plurality of second bit lines; transfer data stored in the first page to the plurality of first bit lines; close the plurality of first switches to connect the plurality of first bit lines to the plurality of second bit lines; transfer the data from the plurality of first bit lines to the plurality of second bit lines; and write the data transferred to the plurality of second bit lines to the second page.

In one embodiment, the memory device further includes: at least a third block of memory cells including a third plurality of pages of memory cells coupled to a plurality of third bit lines and at least a fourth block of memory cells including a fourth plurality of pages of memory cells coupled to a plurality of fourth bit lines, wherein the first block of memory cells are disposed between the second block of memory cells and the third block of memory cells, and the second block of memory cells are disposed between the first block of memory cells and the fourth block of memory cells; a plurality of second switches coupled respectively between the plurality of first bit lines and the plurality of third bit lines; and a plurality of third switches coupled respectively between the plurality of second bit lines and the plurality of fourth bit lines.

In another embodiment, the controller may be further configured to: open the plurality of second switches prior to transferring the data stored in the first page to the plurality of first bit lines; open the plurality of third switches prior to transferring the data from the plurality of first bit lines to the plurality of second bit lines; and close the plurality of second switches and the plurality of third switches after writing the data transferred to the plurality of second bit lines to the second page.

BRIEF DESCRIPTION OF THE DRAWINGS

Illustrative, non-limiting example embodiments will be more clearly understood from the following detailed description in conjunction with the accompanying drawings.

DETAILED DESCRIPTION

Figure 1:
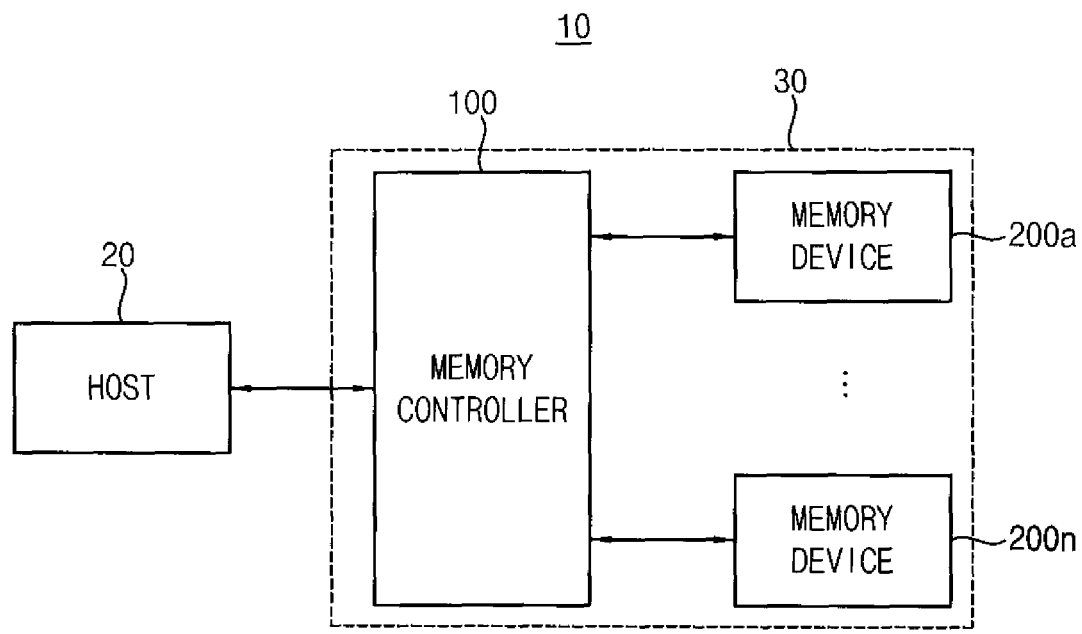
FIG. 1 is a block diagram illustrating an electronic system according to example embodiments.

Various example embodiments will be described more fully with reference to the accompanying drawings, in which some example embodiments are shown. The present inventive concept may, however, be embodied in many different forms and should not be construed as limited to the embodiments set forth herein. Like reference numerals refer to like elements throughout this application.

It will be understood that, although the terms first, second, etc. may be used herein to describe various elements, these elements should not be limited by these terms. These terms are used to distinguish one element from another. For example, unless the context indicates otherwise, a first element could be termed a second element, and, similarly, a second element could be termed a first element, without departing from the scope of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an electronic system according to example embodiments.

Referring to FIG. 1, an electronic system 10 includes a host 20 and a memory system 30. The memory system 30 includes a memory controller 100 and a plurality of memory devices 200a~200n.

The host 20 may communicate with the memory system 30 through an interface protocol such as, for example, Peripheral Component Interconnect-Express (PCI-E), Advanced Technology Attachment (ATA), Serial ATA (SATA), Parallel ATA (PATA), or serial attached SCSI (SAS). In addition, the host 20 may communicate with the memory system 30 through an interface protocol such as Universal Serial Bus (USB), Multi-Media Card (MMC), Enhanced Small Disk Interface (ESDI), or Integrated Drive Electronics (IDE).

The memory controller 100 controls overall operation of the memory system 30. The memory controller 100 controls overall data exchange between the host 20 and the memory devices 200a~200n. For example, the memory controller 100 writes data in the memory devices 200a~200n or reads data from the memory devices 200a~200n in response to request from the host 20.

In addition, the memory controller 100 applies operation commands to the memory devices 200a~200n for controlling the memory devices 200a~200n.

In some embodiments, each of the memory devices 200a~200n may be a dynamic random access memory (DRAM), such as a double data rate synchronous dynamic random access memory (DDR SDRAM), a low power double data rate synchronous dynamic random access memory (LP-DDR SDRAM), a graphics double data rate synchronous dynamic random access memory (GDDR SDRAM), a Rambus dynamic random access memory (RDRAM), etc., or may be other volatile memory devices.

Figure 2:
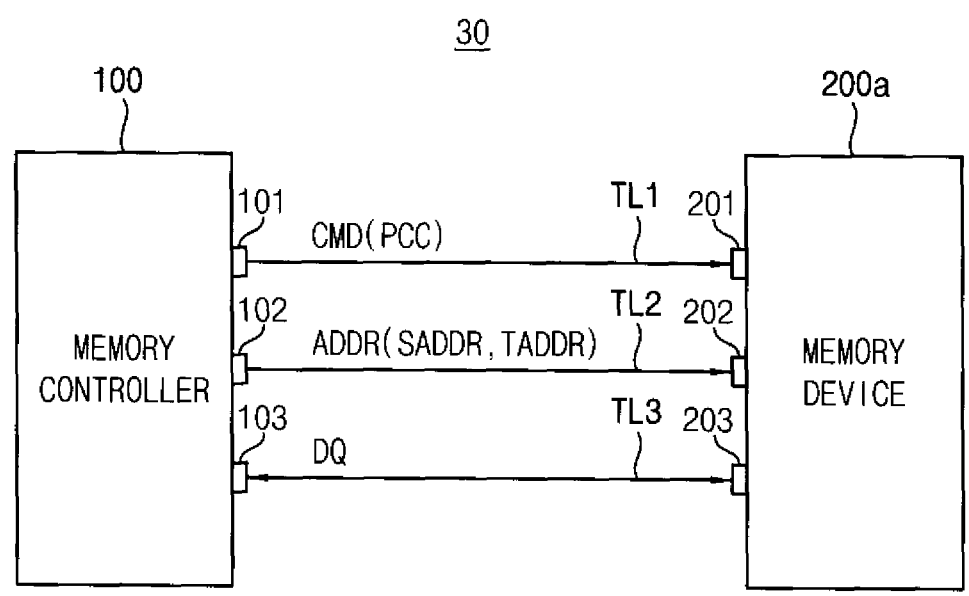
FIG. 2 is a block diagram illustrating an example of the memory system of FIG. 1 according to example embodiments.

FIG. 2 is a block diagram illustrating an example of the memory system of FIG. 1 according to example embodiments.

In FIG. 2, one memory device 200a corresponding to the memory controller 100 is illustrated for convenience.

Referring to FIG. 2, the memory system 30 includes the memory controller 100 and the memory device 200a. The memory controller 100 and the memory devices 200a may be connected to each other through corresponding command pins 101 and 201, corresponding address pins 102 and 202 and corresponding data pins 103 and 203. The command pins 101 and 201 transmit a command signal CMD through a command transmission line TL1, the address pins 102 and 202 transmit an address signal ADDR through an address transmission line TL2, and the data pins 103 and 203 exchange data DQ through a data transmission line TL3.

Referring to FIGS. 1 and 2, the memory controller 100 may provide an address to the memory device 200a through the address pins 102 and 202 and input data to the memory device 200a or output data from the memory device 200a through the data pins 103 and 203 based on the request from the host 20.

In addition, the memory controller 100 may provide a page copy command PCC to the memory device 200a through the command pins 101 and 201 and provide a source address SADDR and a target address TADDR to the memory device 200a through the address pins 102 and 202, and the memory device 200a may perform a page copy operation, which copies data stored in a source page corresponding to the source address SADDR to a target page corresponding to the target address TADDR, in response to the page copy command PCC. The method of copying a page internally in the memory device 200a will be described later.

Figure 3:
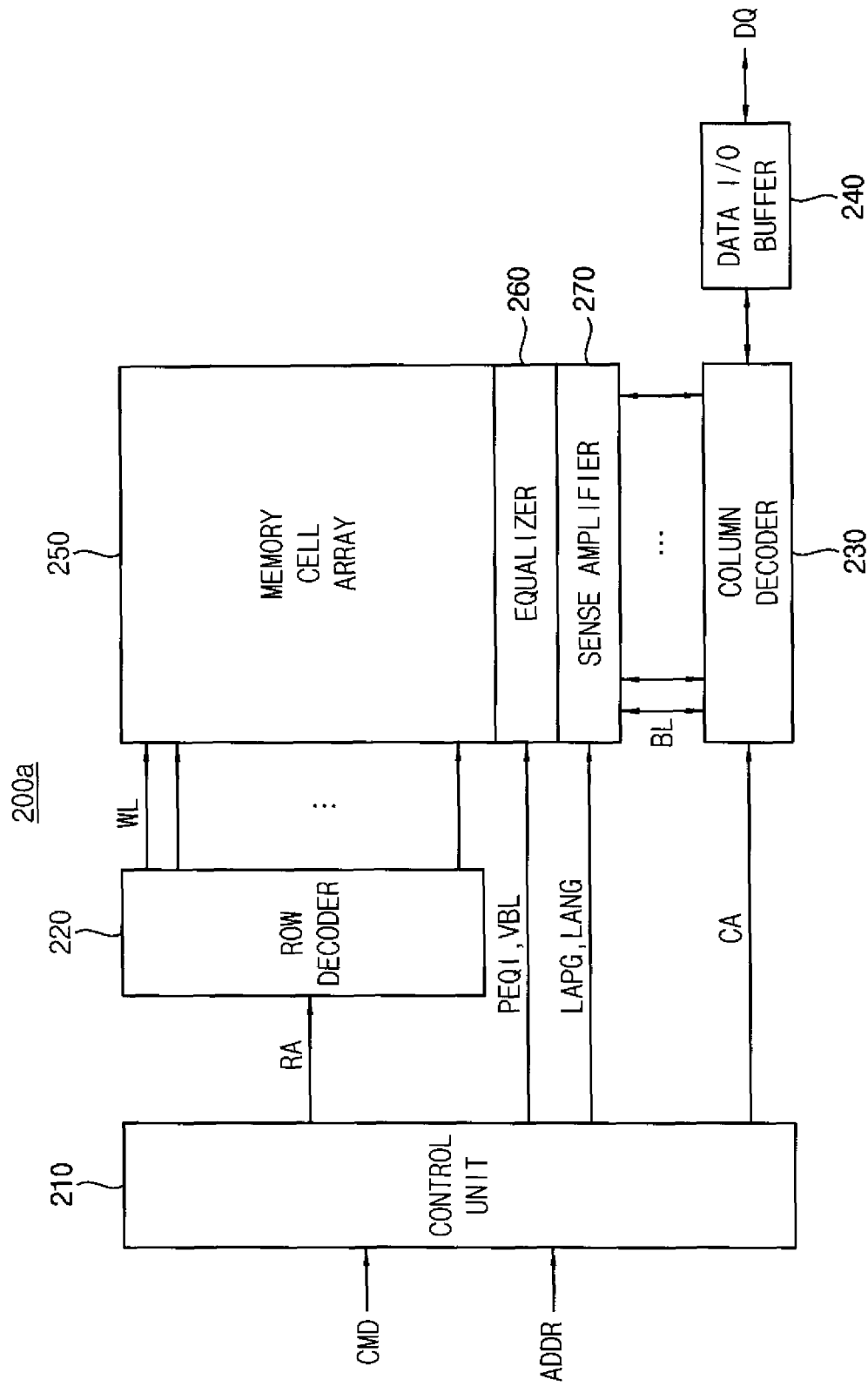
FIG. 3 is a block diagram illustrating an example of the memory device of FIG. 2 according to example embodiments.

FIG. 3 is a block diagram illustrating an example of the memory device of FIG. 2 according to example embodiments.

Referring to FIG. 3, the memory device 200a includes a control unit 210, a row decoder 220, a column decoder 230, a data input/output buffer 240, a memory cell array 250, an equalization unit 260 and a sense amplification unit 270.

The control unit 210 may control operations of the memory device 200a. For example, the control unit 210 may generate control signals for the memory device 200a to perform a write operation or a read operation. The control unit 210 may include a command decoder that decodes the command signal CMD received from the memory controller 100 and a mode register that is used to set an operation mode of the memory device 200a. For example, the command decoder may generate the control signals corresponding to the command signal CMD by decoding a write enable signal (/WE), a row address strobe signal (/RAS), a column address strobe signal (/CAS), a chip select signal (/CS), etc. The control unit 210 may further receive a clock signal (CLK) and a clock enable signal (/CKE) for operating the memory device 200a in a synchronous manner.

In addition, the control unit 210 may receive the page copy command PCC, the source address SADDR and the target address TADDR from the memory controller 100 and control the row decoder 220, the equalization unit 260 and the sense amplification unit 270 to perform the page copy operation, which copies data stored in the source page corresponding to the source address SADDR of the memory cell array 250 to the target page corresponding to the target address TADDR of the memory cell array 250, by providing control signals to the row decoder 220, the equalization unit 260 and the sense amplification unit 270. For example, the control unit 210 may provide a row address RA to the row decoder 220, provide an equalization control signal PEQI and a precharge voltage VBL to the equalization unit 260 and provide a high bias control signal LAPG and a low bias control signal LANG to the sense amplification unit 270 to control the page copy operation.

The memory cell array 250 may include a plurality of memory cells coupled to a plurality of word lines WL and a plurality of bit lines BL. The memory cell array 250 may include a plurality of memory blocks, and each of the plurality of memory blocks may include a plurality of pages. For example, one page may include one row of memory cells coupled to a same word line WL.

The equalization unit 260 may precharge the plurality of bit lines BL to the precharge voltage VBL in response to the equalization control signal PEQI.

The sense amplification unit 270, which may be a sense amplifier, may amplify voltages of the plurality of bit lines BL in response to the high bias control signal LAPG and the low bias control signal LANG. For example, the sense amplification unit 270 may amplify a voltage of a bit line BL to a supply voltage when the voltage of the bit line BL is higher than the precharge voltage VBL, and amplify a voltage of a bit line BL to a ground voltage when the voltage of the bit line BL is lower than the precharge voltage VBL.

The row decoder 220 may be coupled to the memory cell array 250 through the plurality of word lines WL. The row decoder 220 may decode the row address RA provided from the control unit 210 and select one of the plurality of pages by activating one of the plurality of word lines WL corresponding to the row address RA. For example, the row decoder 220 may apply a word line driving voltage to the word line WL corresponding to the row address RA.

The column decoder 230 may be coupled to the memory cell array 250, the equalization unit 260 and the sense amplification unit 270 through the plurality of bit lines BL. The column decoder 230 may decode a column address CA provided from the control unit 210, select one of the plurality of bit lines BL corresponding to the column address CA, and provide data DQ received through the selected bit line BL to the data input/output buffer 240 or provide data DQ received from the data input/output buffer 240 to the selected bit line BL.

The data input/output buffer 240 may transmit data DQ to the memory controller 100 through the data pin 203 or receive data DQ from the memory controller 100 through the data pin 203.

Figure 4:
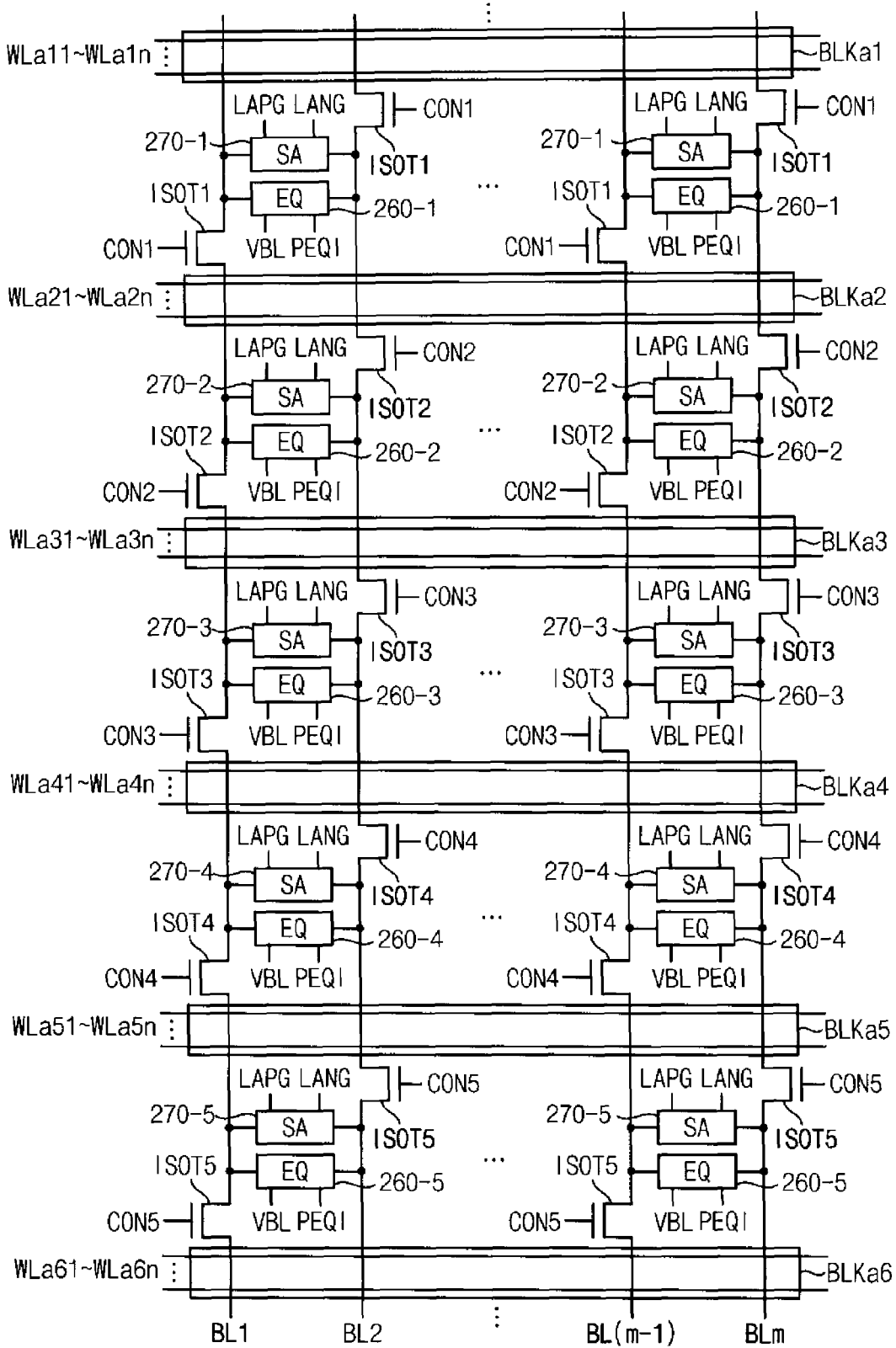
FIG. 4 is a block diagram illustrating an example of a memory cell array, an equalization unit and a sense amplification unit included in the memory device of FIG. 3.

FIG. 4 is a block diagram illustrating an example of a memory cell array, an equalization unit and a sense amplification unit included in the memory device of FIG. 3.

Referring to FIG. 4, the memory cell array 250 may include a plurality of memory blocks. In FIG. 4, first through sixth memory blocks BLKa1, BLKa2, BLKa3, BLKa4, BLKa5 and BLKa6 are illustrated among the plurality of memory blocks included in the memory cell array 250.

Each of the first through sixth memory blocks BLKa1, BLKa2, BLKa3, BLKa4, BLKa5 and BLKa6 may include a plurality of pages. In FIG. 4, each of the plurality of memory blocks includes first through n-th pages. Here, n represents a positive integer. For example, the first through n-th pages included in a first memory block BLKa1 may be coupled to first through n-th word lines WLa11~WLa1$n$, respectively, the first through n-th pages included in a second memory block BLKa2 may be coupled to first through n-th word lines WLa21~WLa2$n$, respectively, the first through n-th pages included in a third memory block BLKa3 may be coupled to first through n-th word lines WLa31~WLa3$n$, respectively, the first through n-th pages included in a fourth memory block BLKa4 may be coupled to first through n-th word lines WLa41~WLa4$n$, respectively, the first through n-th pages included in a fifth memory block BLKa5 may be coupled to first through n-th word lines WLa51~WLa5$n$, respectively, and the first through n-th pages included in a sixth memory block BLKa6 may be coupled to first through n-th word lines WLa61~WLa6$n$, respectively. According to example embodiments, each of the plurality of memory blocks may include different number of pages.

As illustrated in FIG. 4, bit lines of adjacent memory blocks may be coupled to each other by isolation transistors ISOT1, ISOT2, ISOT3, ISOT4 and ISOT5 so that the plurality of memory blocks included in the memory cell array 250 may be commonly connected to the plurality of bit lines BL1, BL2, . . . , BL(m−1), BLm. Here, m represents a positive even integer. For example, each of bit lines of the first memory block BLKa1 and each of bit lines of the second memory block BLKa2 may be coupled to each other by a first isolation transistor ISOT1, each of bit lines of the second memory block BLKa2 and each of bit lines of the third memory block BLKa3 may be coupled to each other by a second isolation transistor ISOT2, each of bit lines of the third memory block BLKa3 and each of bit lines of the fourth memory block BLKa4 may be coupled to each other by a third isolation transistor ISOT3, each of bit lines of the fourth memory block BLKa4 and each of bit lines of the fifth memory block BLKa5 may be coupled to each other by a fourth isolation transistor ISOT4, and each of bit lines of the fifth memory block BLKa5 and each of bit lines of the sixth memory block BLKa6 may be coupled to each other by a fifth isolation transistor ISOT5.

The isolation transistors ISOT1, ISOT2, ISOT3, ISOT4 and ISOT5 may control connections between bit lines of adjacent memory blocks in response to isolation control signals CON1, CON2, CON3, CON4 and CON5. For example, the first isolation transistor ISOT1 may turn on in response to a first isolation control signal CON1, the second isolation transistor ISOT2 may turn on in response to a second isolation control signal CON2, the third isolation transistor ISOT3 may turn on in response to a third isolation control signal CON3, the fourth isolation transistor ISOT4 may turn on in response to a fourth isolation control signal CON4, and the fifth isolation transistor ISOT5 may turn on in response to a fifth isolation control signal CON5. The first through fifth isolation control signals CON1, CON2, CON3, CON4 and CON5 may be provided from the control unit 210.

As described herein, a bit line may refer to a common bit line shared between a plurality of memory blocks, and the term may also refer to a bit line for a particular memory block, which is coupled to bit lines of other memory blocks to form a common bit line. A common bit line may be described as comprising a plurality of sub-bit lines. The isolation transistors may be referred to herein as switches, which may be open (e.g., transistor off) or closed (e.g., transistor on).

For the purposes of simplifying discussion, the terms "coupled" and "connected" or "disconnected" as used herein in connection with memory blocks and isolation transistors, are intended to convey certain meaning. For example, two adjacent blocks are described as being "coupled" to each other through a set of isolation transistors coupled to the bit lines of those blocks. This coupling can be thought of as a physical coupling. Similarly, two non-adjacent blocks may be coupled to each other through more than one set of isolation transistors. As described above, certain bit lines in adjacent blocks may be coupled to each other by respective isolation transistors. The terms "connected" and "disconnected" when used in relation to these blocks are intended to indicate whether the bit lines in adjacent blocks are communicatively, electrically connected or not (e.g., whether a switch between the bit lines is closed or open). For example, when a bit line in a first block is described as being connected to a bit line in a second block, the same signal may be shared by both bit lines, for example, due to a transistor between the bit lines being turned on. When a bit line in a first block is described as being disconnected from a bit line in a second block, the same signal may not be shared by both bit lines, for example, due to a transistor between the bit lines being turned off.

The equalization unit 260 may include a plurality of equalizers EQ 260-1, 260-2, 260-3, 260-4 and 260-5 located between the plurality of memory blocks, and the sense amplification unit 270 may include a plurality of sense amplifiers SA 270-1, 270-2, 270-3, 270-4 and 270-5 located between the plurality of memory blocks. For example, for each bit line, a first equalizer 260-1 and a first sense amplifier 270-1 may be located between the first memory block BLKa1 and the second memory block BLKa2, a second equalizer 260-2 and a second sense amplifier 270-2 may be located between the second memory block BLKa2 and the third memory block BLKa3, a third equalizer 260-3 and a third sense amplifier 270-3 may be located between the third memory block BLKa3 and the fourth memory block BLKa4, a fourth equalizer 260-4 and a fourth sense amplifier 270-4 may be located between the fourth memory block BLKa4 and the fifth memory block BLKa5, and a fifth equalizer 260-5 and a fifth sense amplifier 270-5 may be located between the fifth memory block BLKa5 and the sixth memory block BLKa6.

As illustrated in FIG. 4, the plurality of equalizers EQ 260-1, 260-2, 260-3, 260-4 and 260-5 and the plurality of sense amplifiers SA 270-1, 270-2, 270-3, 270-4 and 270-5 may be coupled to a first electrode (e.g., upper electrode in FIG. 4) of isolation transistors ISOT1, ISOT2, ISOT3, ISOT4 and ISOT5 in odd bit lines BL(2k−1) and coupled to a second electrode (e.g., lower electrode in FIG. 4) of isolation transistors ISOT1, ISOT2, ISOT3, ISOT4 and ISOT5 in even bit lines BL(2k). Here, k represents a positive number smaller than or equal to m/2. When a number of bit lines is m, a number of the equalizers EQ located between adjacent memory blocks and a number of the sense amplifiers SA located between adjacent memory blocks may be m/2.

Each of the equalizers EQ may precharge bit lines to which the equalizer is coupled to the precharge voltage VBL in response to the equalization control signal PEQI. Each of the sense amplifiers SA may amplify voltages of bit lines to which the sense amplifier is coupled in response to the high bias control signal LAPG and the low bias control signal LANG. For example, each of the sense amplifiers SA may amplify a voltage of a bit line to which the sense amplifier is coupled to the supply voltage when the voltage of the bit line is higher than the precharge voltage VBL, and amplify a voltage of a bit line to which the sense amplifier is coupled to the ground voltage when the voltage of the bit line is lower than the precharge voltage VBL.

Adjacent memory blocks may share the sense amplifiers SA located between the adjacent memory blocks to perform a read operation. For example, in a read operation for reading data stored in a page included in the third memory block BLKa3, the plurality of bit lines BL1, BL2, . . . , BL(m−1), BLm may be precharged, the second isolation transistor ISOT2 and the third isolation transistor ISOT3 may be turned off, and then data in odd bit lines BL(2k−1) may be sensed using the third sense amplifier 270-3 and data in even bit lines BL(2k) may be sensed using the second sense amplifier 270-2. After that, the third isolation transistor ISOT3 may be turned on such that the sensed data are transferred to the column decoder 230 through the plurality of bit lines BL1, BL2, . . . , BL(m−1), BLm. Alternatively, in a read operation for reading data stored in a page included in the fourth memory block BLKa4, the plurality of bit lines BL1, BL2, . . . , BL(m−1), BLm may be precharged, the third isolation transistor ISOT3 and the fourth isolation transistor ISOT4 may be turned off, and then data in odd bit lines BL(2k−1) may be sensed using the fourth sense amplifier 270-4 and data in even bit lines BL(2k) may be sensed using the third sense amplifier 270-3. After that, the fourth isolation transistor ISOT4 may be turned on such that the sensed data are transferred to the column decoder 230 through the plurality of bit lines BL1, BL2, . . . , BL(m−1), BLm.

Figure 5:
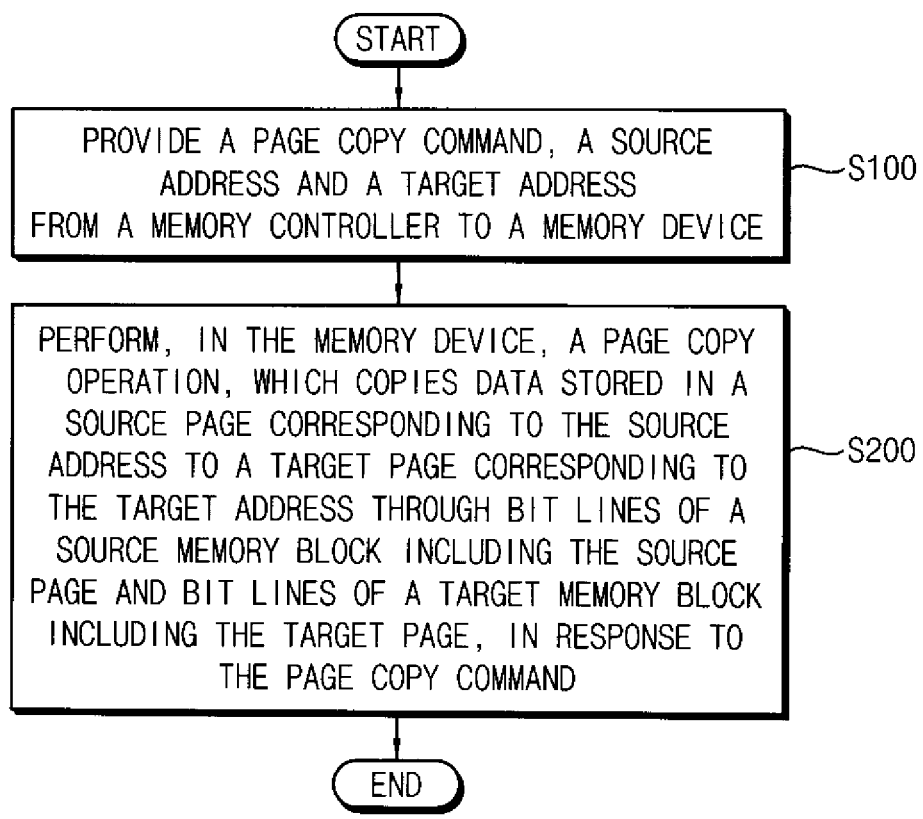
FIG. 5 is a flow chart illustrating a method of managing pages in a memory system according to example embodiments.

FIG. 5 is a flow chart illustrating a method of managing pages in a memory system according to example embodiments.

Hereinafter, a method of managing pages in the memory system 30 will be described with reference to FIGS. 2 to 5.

Referring to FIG. 5, in a method of managing pages in the memory system 30 according to some example embodiments, the memory controller 100 provides the page copy command PCC, the source address SADDR and the target address TADDR to the memory device 200a (step S100), and the memory device 200a performs a page copy operation, which copies data stored in a source page corresponding to the source address SADDR to a target page corresponding to the target address TADDR through bit lines of a source memory block including the source page and bit lines of a target memory block including the target page, in response to the page copy command PCC (step S200).

Figure 6:
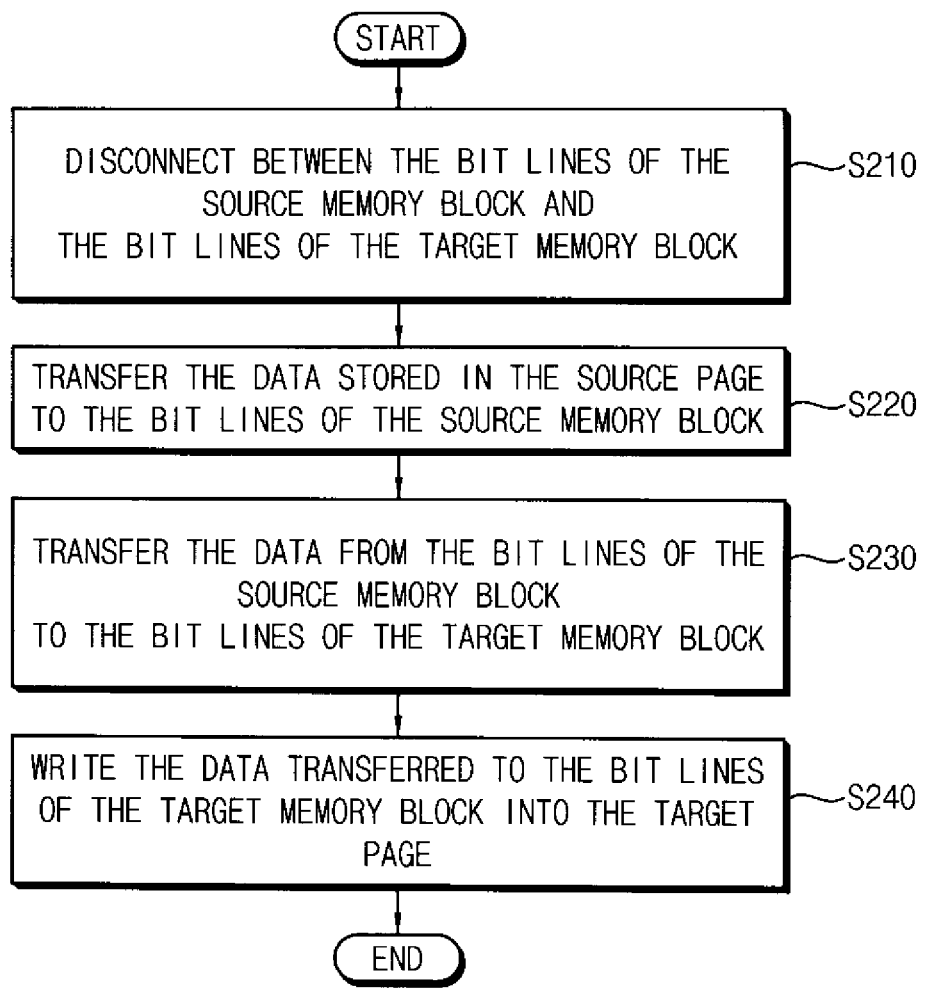
FIG. 6 is a flow chart illustrating an example of performing a page copy operation of FIG. 5, according to example embodiments.

FIG. 6 is a flow chart illustrating an example of performing a page copy operation of FIG. 5, according to one embodiment.

Referring to FIG. 6, in a method of copying a page in the memory device 200a according to example embodiments, the bit lines of the source memory block and the bit lines of the target memory block may be disconnected from each other (step S210), the data stored in the source page may be transferred to the bit lines of the source memory block (step S220), the data may be transferred from the bit lines of the source memory block to the bit lines of the target memory block (step S230), and the data transferred to the bit lines of the target memory block may be written into the target page (step S240).

The method of copying a page in the memory device 200a illustrated in FIG. 6 may be performed differently in the case where the target memory block is adjacent to the source memory block and in the case where at least one memory block is located between the target memory block and the source memory block.

FIGS. 7 to 11 are diagrams for describing an exemplary method of copying a page in the memory device of FIG. 6 in the case where a target memory block is adjacent to a source memory block.

Hereinafter, a method of copying a page in the memory device 200a in the case where the target memory block is adjacent to the source memory block will be described with reference to FIGS. 7 to 11.

In FIGS. 7 to 11, the third memory block BLKa3 is the source memory block and the second memory block BLKa2 is the target memory block as an example.

Figure 7:
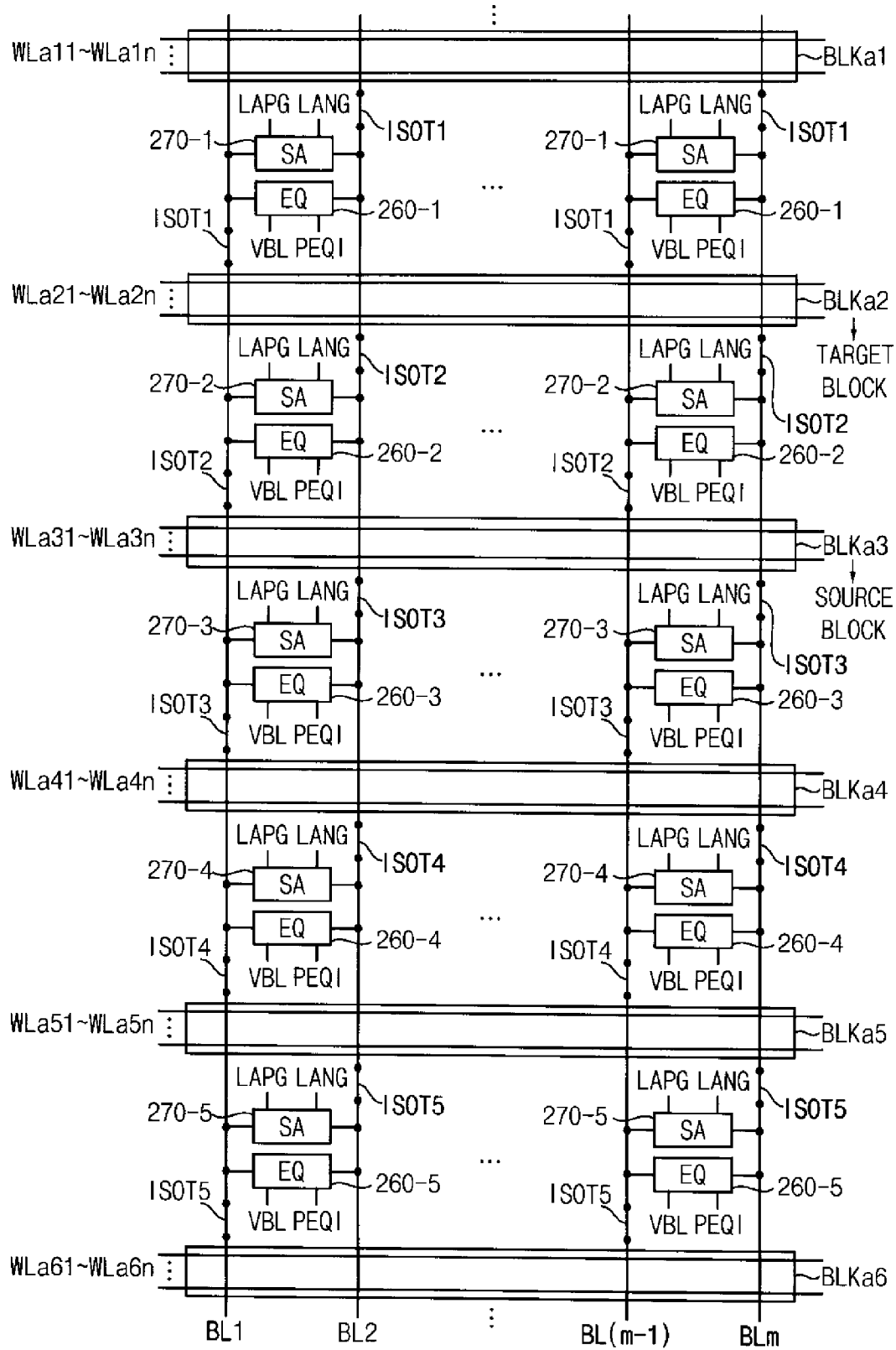
FIGS. 7 to 11 are diagrams for describing a method of copying a page in the memory device of FIG. 6 in the case that a target memory block is adjacent to a source memory block, according to example embodiments.

FIG. 7 represents an initial state of the memory device 200a before performing the page copy operation in the case that the target memory block BLKa2 is adjacent to the source memory block BLKa3. For example, there may not be any memory blocks between target memory block BLKa2 and source memory block BLKa3.

As illustrated in FIG. 7, before performing the page copy operation, bit lines of each of the plurality of memory blocks may be precharged to the precharge voltage VBL using the plurality of equalizers EQ 260-1, 260-2, 260-3, 260-4 and 260-5 and the isolation transistors ISOT1, ISOT2, ISOT3, ISOT4 and ISOT5 may be turned on to connected between bit lines of adjacent memory blocks.

Figure 8:
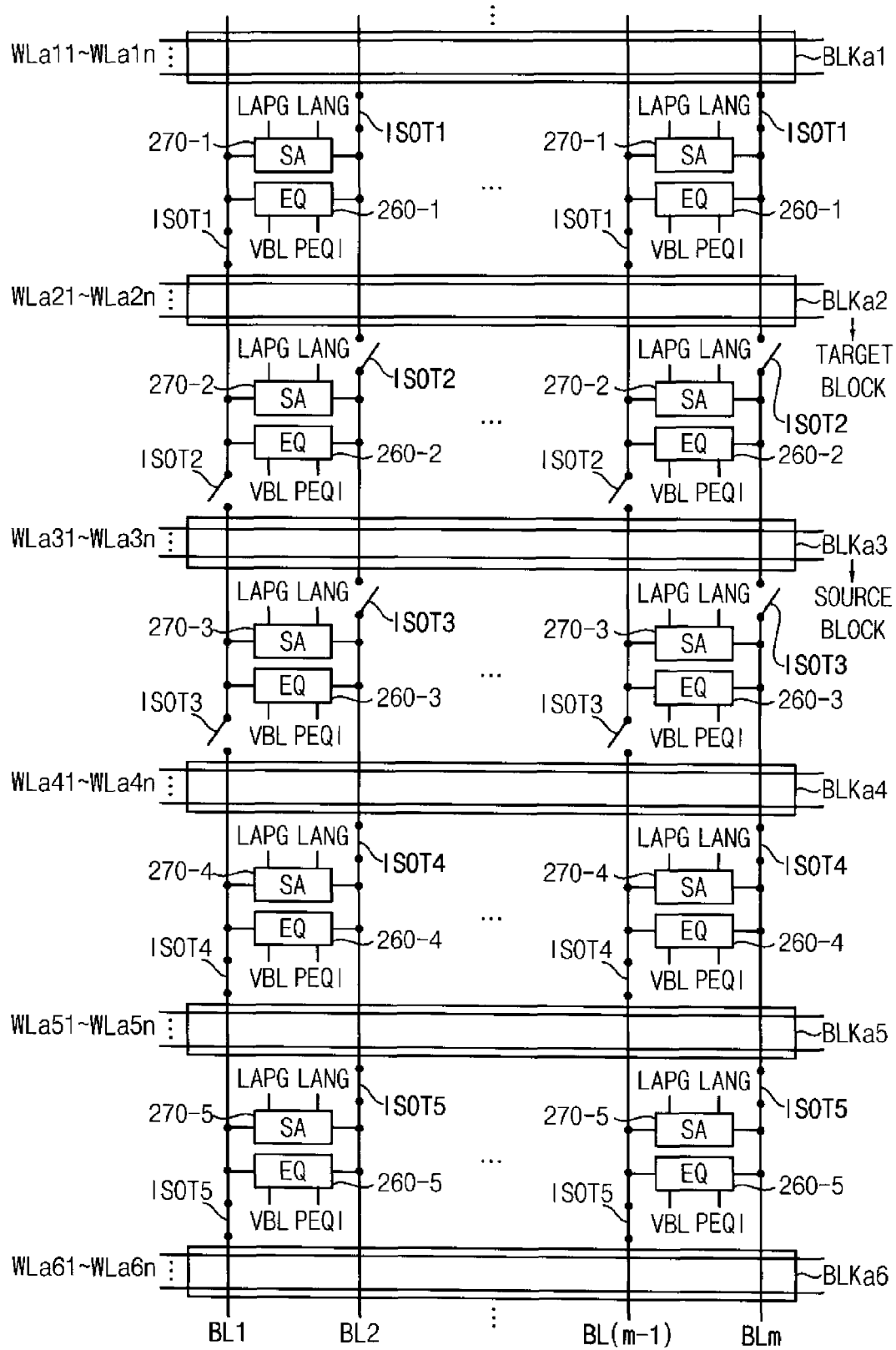

After that, as illustrated in FIG. 8, the second isolation transistor ISOT2 and the third isolation transistor ISOT3 may be turned off such that the bit lines of the source memory block BLKa3 may be disconnected from bit lines of memory blocks BLKa2 and BLKa4 adjacent to the source memory block BLKa3. As such, the bit lines of the source memory block BLKa3 and the bit lines of the target memory block BLKa2 may be disconnected from each other (step S210).

After that, a word line of the source page may be activated such that charge sharing may occur between memory cells of the source page and the bit lines of the source memory block BLKa3, which are precharged to the precharge voltage VBL. For example, when a memory cell stores "1", a voltage of a bit line coupled to the memory cell may slightly increase from the precharge voltage VBL, and when a memory cell stores "0", a voltage of a bit line coupled to the memory cell may slightly decrease from the precharge voltage VBL. After that, the sense amplifiers 270-2 and 270-3 of the source memory block BLKa3 may be activated to amplify voltages of the bit lines of the source memory block BLKa3. For example, the third sense amplifier 270-3 may amplify voltages of odd bit lines BL(2k−1) of the source memory block BLKa3, and the second sense amplifier 270-2 may amplify voltages of even bit lines BL(2k) of the source memory block BLKa3. Therefore, the bit lines of the source memory block BLKa3 may be set to one of the supply voltage and the ground voltage based on the data stored in the source page. As such, the data stored in the source page may be transferred to the bit lines of the source memory block BLKa3 (step S220).

Figure 9:
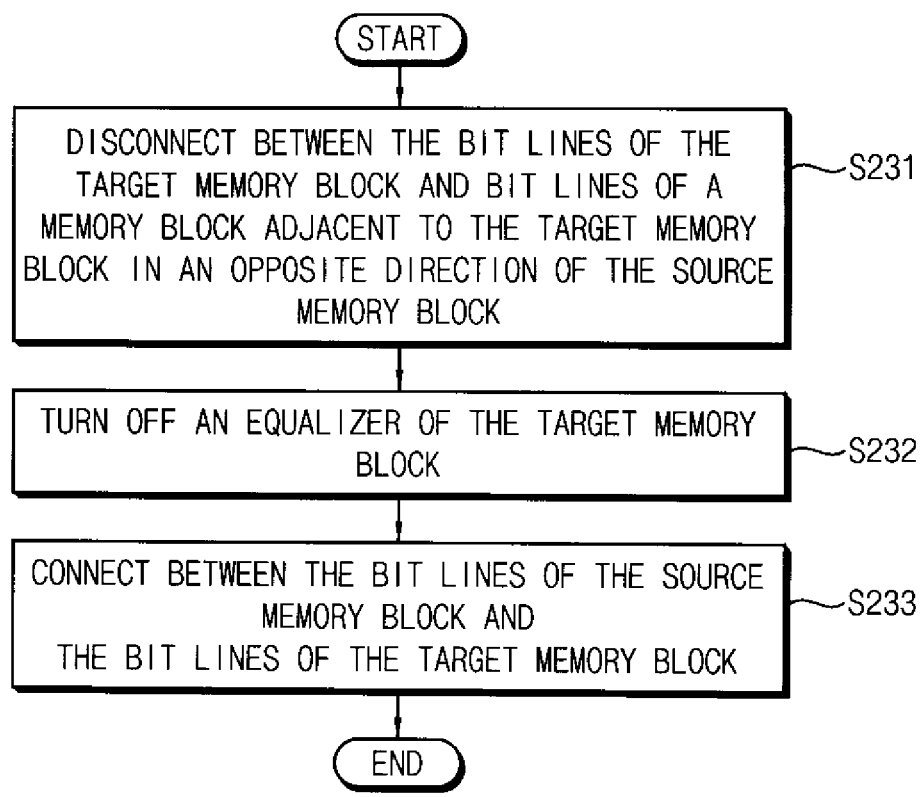

FIG. 9 is a flow chart illustrating an example of transferring the data from the bit lines of the source memory block to the bit lines of the target memory block (step S230) of FIG. 6 in the case that the target memory block is adjacent to the source memory block.

Figure 10:
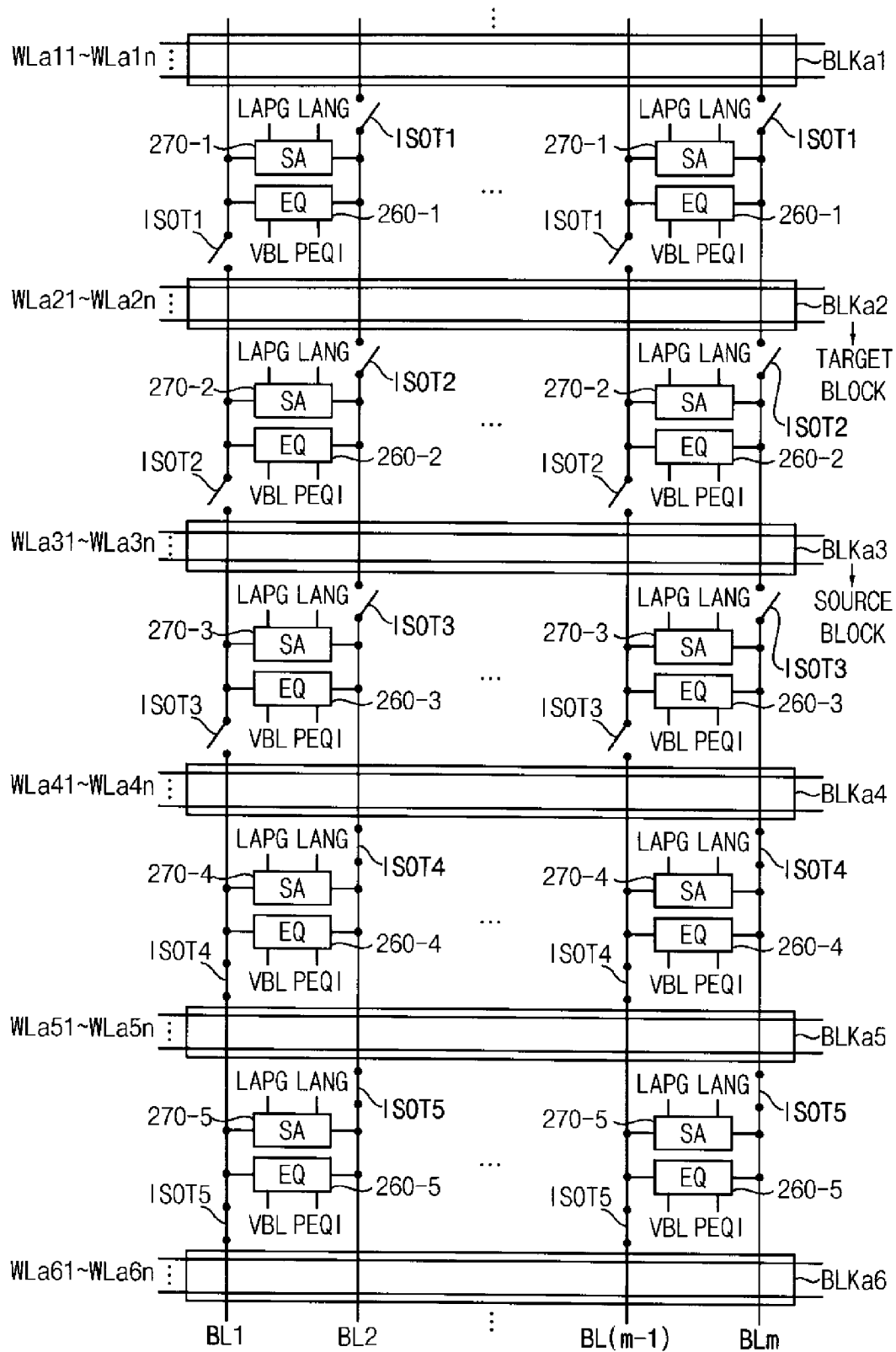

Referring to FIGS. 9 and 10, the first isolation transistor ISOT1 may be turned off such that the bit lines of the target memory block BLKa2 may be disconnected from bit lines of a memory block BLKa1 adjacent to the target memory block BLKa2 in an opposite direction of the source memory block BLKa3 (step S231). The second equalizer 260-2 of the target memory block BLKa2 may be turned off such that odd bit lines BL(2k−1) of the target memory block BLKa2 and even bit lines BL(2k) of the target memory block BLKa2 may be disconnected from each other (step S232).

Figure 11:
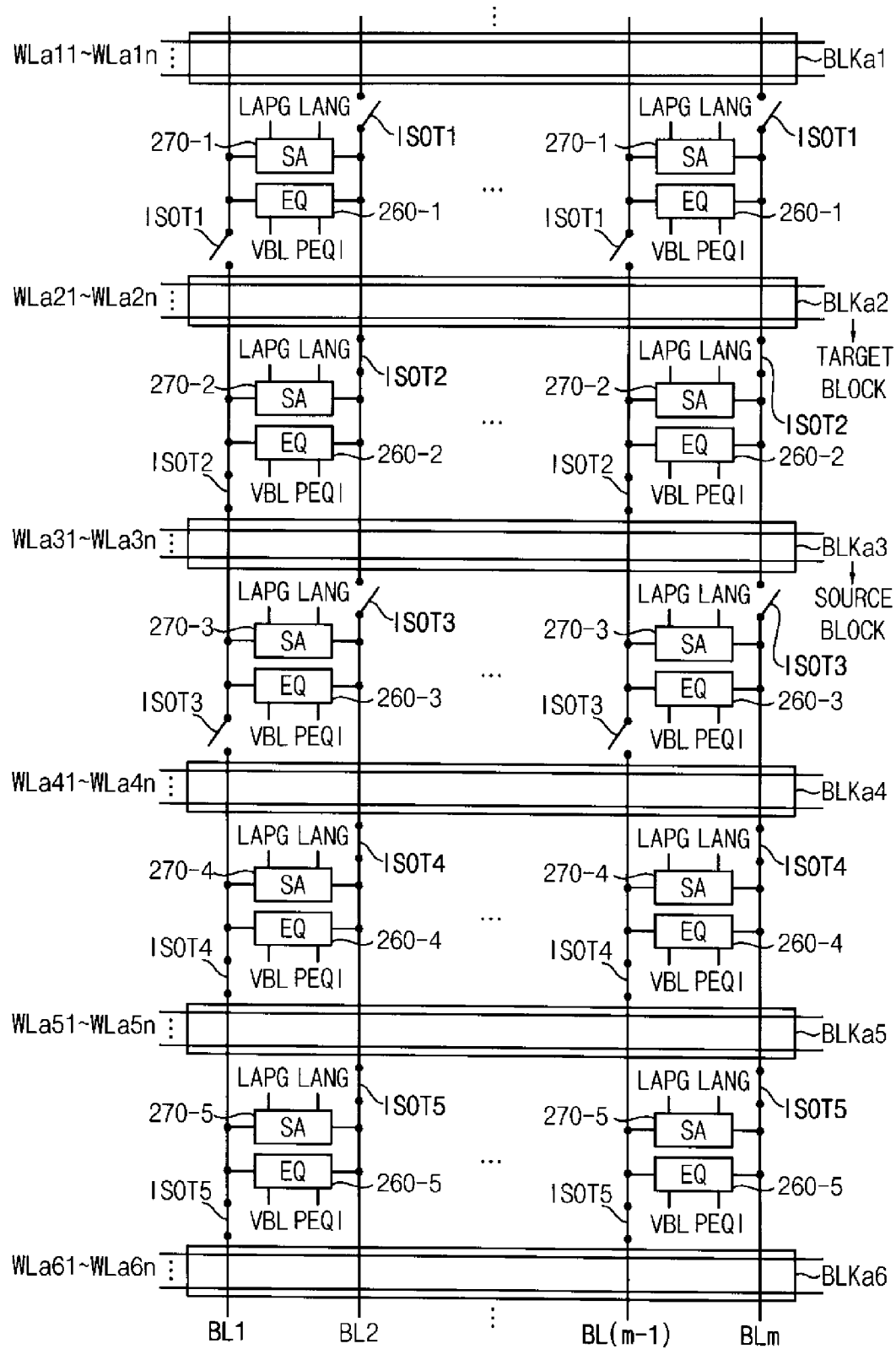

After that, as illustrated in FIG. 11, the second isolation transistor ISOT2 may be turned on such that the bit lines of the source memory block BLKa3 and the bit lines of the target memory block BLKa2 may be connected to each other (step S233).

As such, the data may be transferred from the bit lines of the source memory block BLKa3 to the bit lines of the target memory block BLKa2 (step S230).

After that, a word line of the target page may be activated such that the data transferred to the bit lines of the target memory block BLKa2 may be written into the target page (step S240).

After writing the data transferred to the bit lines of the target memory block BLKa2 into the target page, the bit lines of the source memory block BLKa3 and the bit lines of the target memory block BLKa2 may be precharged to the precharge voltage VBL, and the isolation transistors ISOT1, ISOT2, ISOT3, ISOT4 and ISOT5 may be turned on to connect between bit lines of adjacent memory blocks such that the memory device 200a may be in the initial state as illustrated in FIG. 7.

Through the steps described above, the memory device 200a may internally perform the page copy operation in the case where the target memory block is adjacent to the source memory block.

FIGS. 12 to 18 are diagrams for describing a method of copying a page in the memory device of FIG. 6 in the case that at least one memory block is located between a target memory block and a source memory block.

Hereinafter, a method of copying a page in the memory device 200a in the case that at least one memory block is located between the target memory block and the source memory block will be described with reference to FIGS. 12 to 18.

In FIGS. 12 to 18, the fifth memory block BLKa5 is the source memory block and the second memory block BLKa2 is the target memory block as an example.

Figure 12:
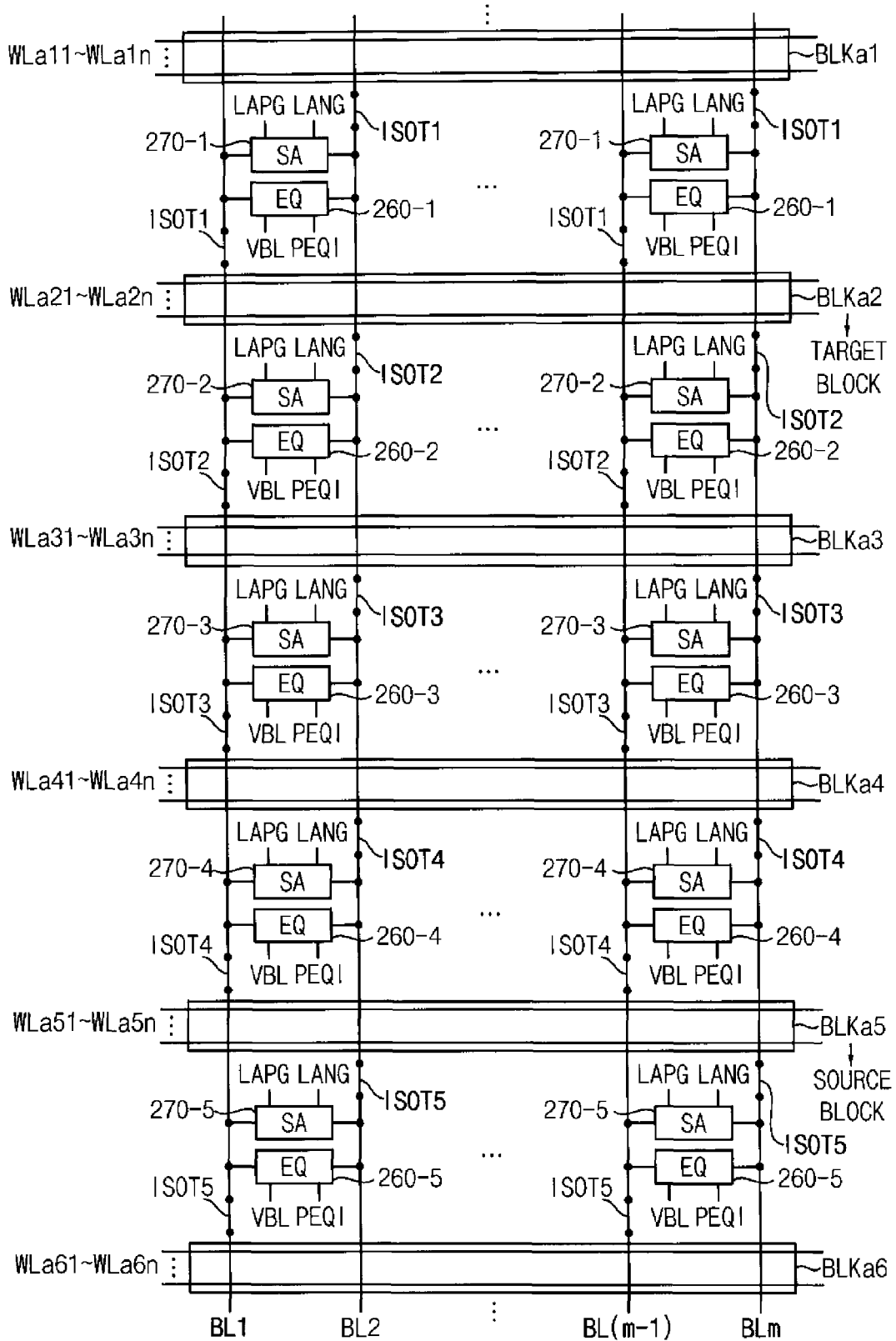
FIGS. 12 to 18 are diagrams for describing a method of copying a page in the memory device of FIG. 6 in the case that at least one memory block is located between a target memory block and a source memory block, according to example embodiments.

FIG. 12 represents an initial state of the memory device 200a before performing the page copy operation in the case that at least one memory block is located between the target memory block BLKa2 and the source memory block BLKa5.

As illustrated in FIG. 12, before performing the page copy operation, bit lines of each of the plurality of memory blocks may be precharged to the precharge voltage VBL using the plurality of equalizers EQ 260-1, 260-2, 260-3, 260-4 and 260-5 and the isolation transistors ISOT1, ISOT2, ISOT3, ISOT4 and ISOT5 may be turned on to connected between bit lines of adjacent memory blocks.

Figure 13:
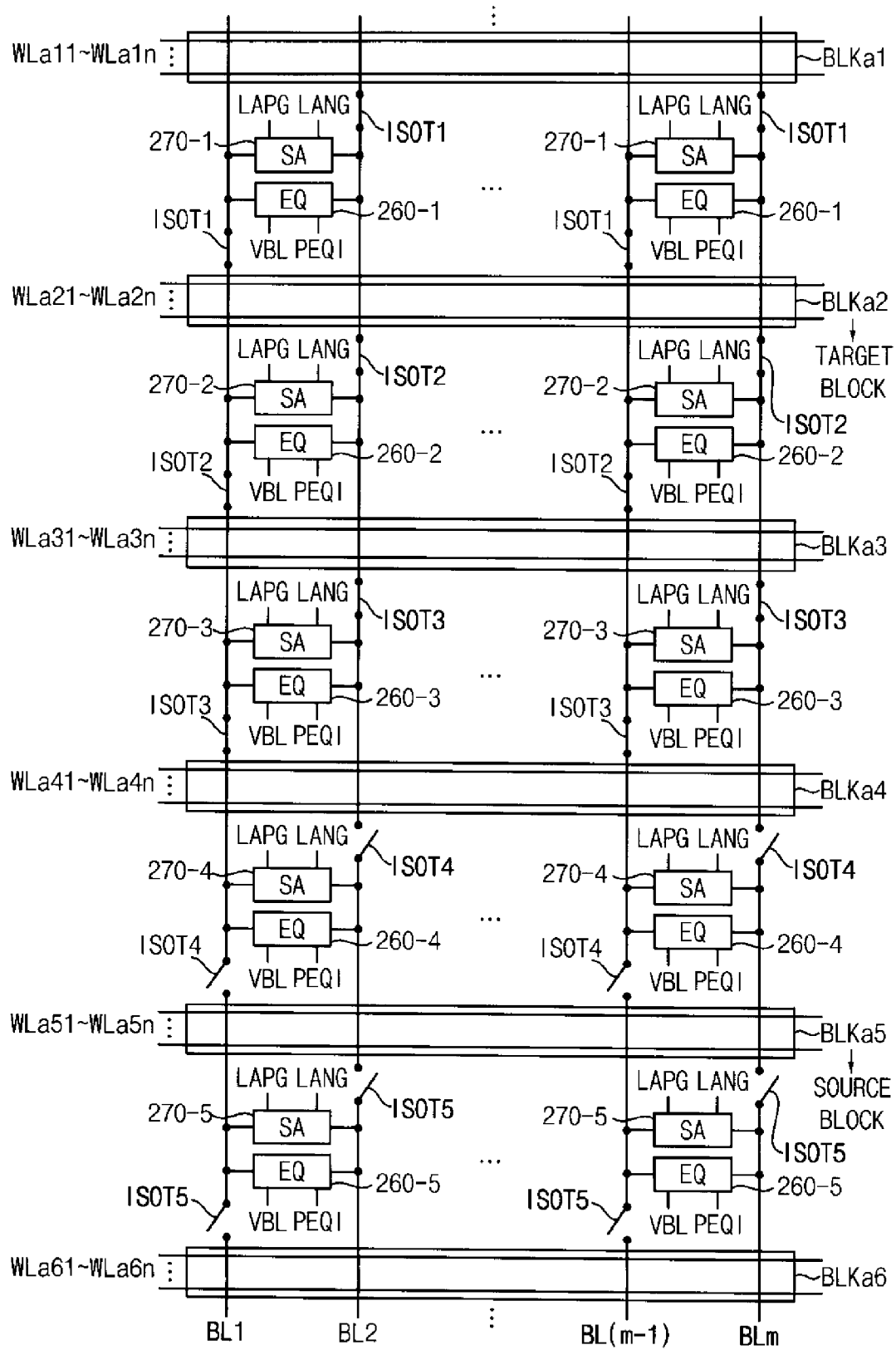

After that, as illustrated in FIG. 13, the fourth isolation transistor ISOT4 and the fifth isolation transistor ISOT5 may be turned off such that the bit lines of the source memory block BLKa5 may be disconnected from bit lines of memory blocks BLKa4 and BLKa6 adjacent to the source memory block BLKa5. As such, the bit lines of the source memory block BLKa5 and the bit lines of the target memory block BLKa2 may be disconnected from each other (step S210).

After that, a word line of the source page may be activated such that charge sharing may occur between memory cells of the source page and the bit lines of the source memory block BLKa5, which are precharged to the precharge voltage VBL. For example, when a memory cell stores "1", a voltage of a bit line coupled to the memory cell may slightly increase from the precharge voltage VBL, and when a memory cell stores "0", a voltage of a bit line coupled to the memory cell may slightly decrease from the precharge voltage VBL. After that, the sense amplifiers 270-4 and 270-5 of the source memory block BLKa5 may be activated to amplify voltages of the bit lines of the source memory block BLKa5. For example, the fifth sense amplifier 270-5 may amplify voltages of odd bit lines BL(2k−1) of the source memory block BLKa5, and the fourth sense amplifier 270-4 may amplify voltages of even bit lines BL(2k) of the source memory block BLKa5. Therefore, the bit lines of the source memory block BLKa5 may be set to one of the supply voltage and the ground voltage based on the data stored in the source page. As such, the data stored in the source page may be transferred to the bit lines of the source memory block BLKa5 (step S220).

Figure 14:
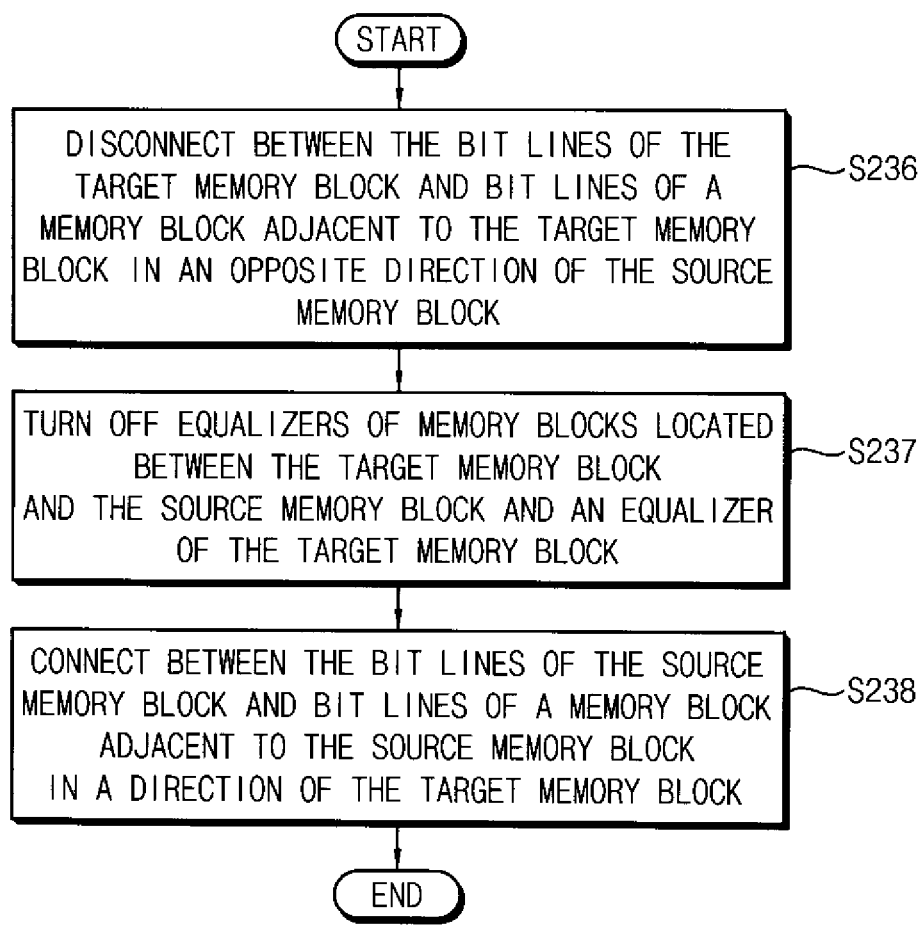

FIG. 14 is a flow chart illustrating an example of transferring the data from the bit lines of the source memory block to the bit lines of the target memory block (step S230) of FIG. 6 in the case where at least one memory block is located between the target memory block and the source memory block.

Figure 15:
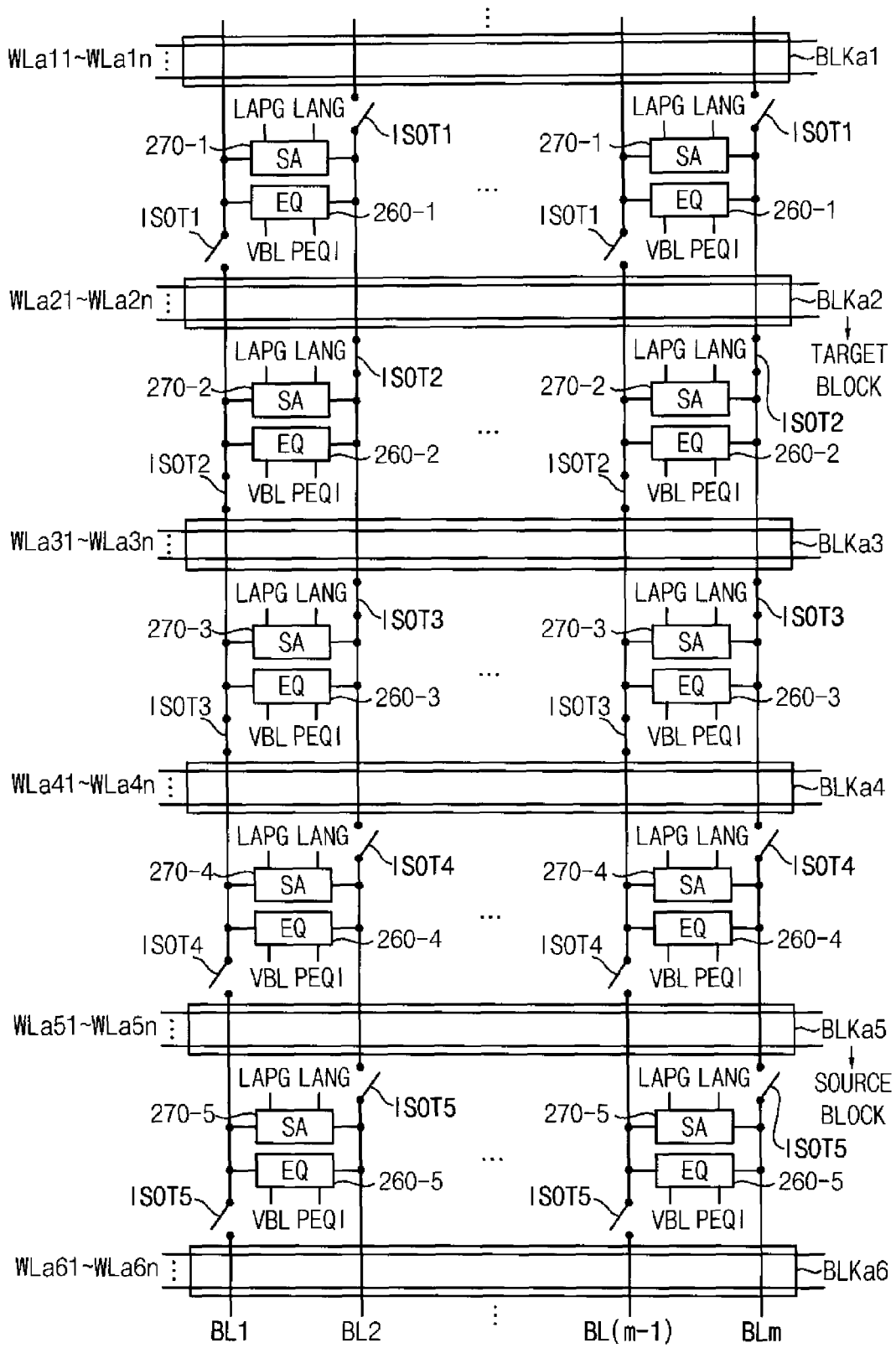

Referring to FIGS. 14 and 15, the first isolation transistors ISOT1 may be turned off such that the bit lines of the target memory block BLKa2 may be disconnected from bit lines of a memory block BLKa1 adjacent to the target memory block BLKa2 in an opposite direction of the source memory block BLKa5 (step S236). The second equalizer 260-2 of the target memory block BLKa2 and the third and fourth equalizers 260-3 and 260-4 of memory blocks BLKa3 and BLKa4 located between the target memory block BLKa2 and the source memory block BLKa5 may be turned off such that odd bit lines BL(2k−1) and even bit lines BL(2k) may be disconnected from each other between the source memory block BLKa5 and the target memory block BLKa2 (step S237).

Figure 16:
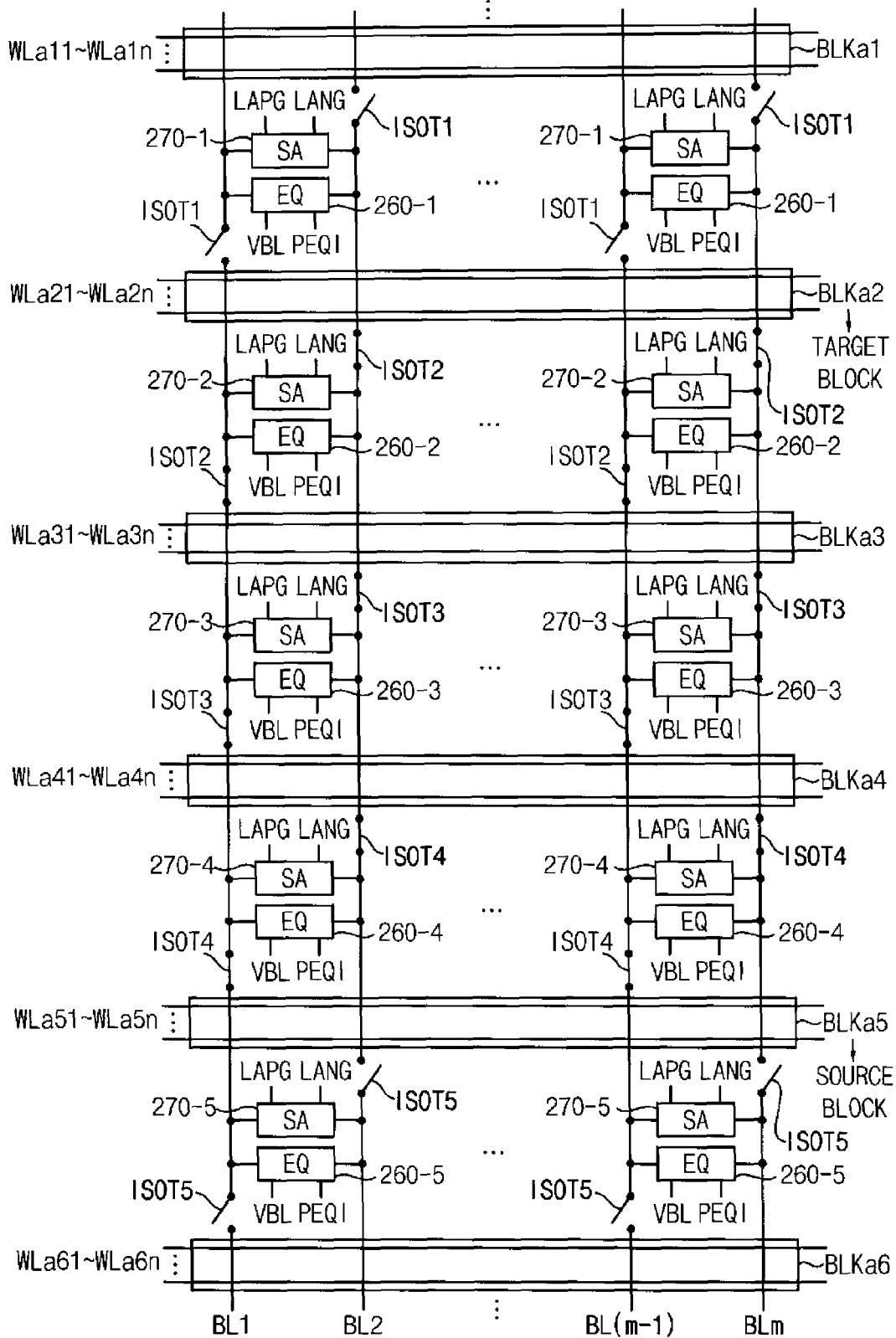

After that, as illustrated in FIG. 16, the fourth isolation transistors ISOT4 may be turned on such that the bit lines of the source memory block BLKa5 and bit lines of a memory block BLKa4 adjacent to the source memory block BLKa5 in a direction of the target memory block BLKa2 may be connected to each other (step S238).

As such, the data may be transferred from the bit lines of the source memory block BLKa5 to the bit lines of the target memory block BLKa2 (step S230).

Figure 17:
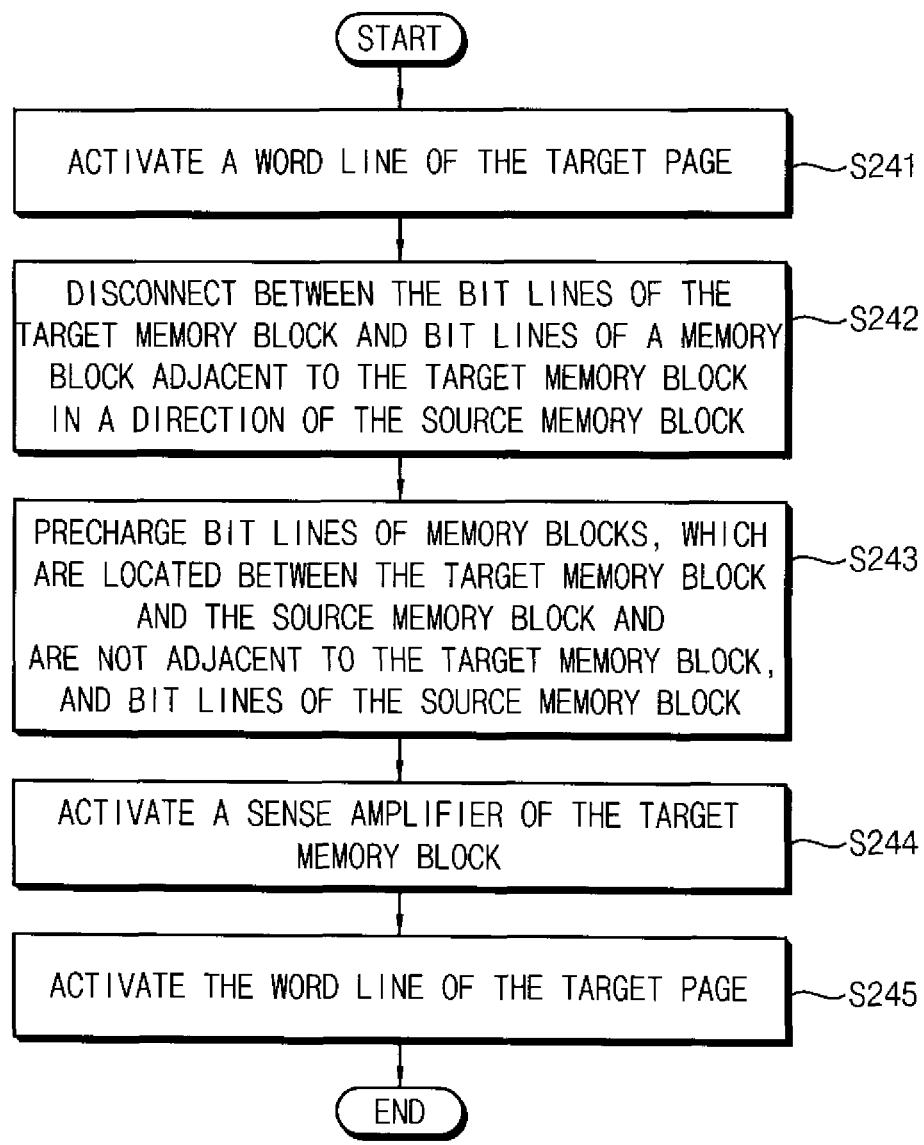

FIG. 17 is a flow chart illustrating an example of writing the data transferred to the bit lines of the target memory block into the target page (step S240) of FIG. 6 in the case that at least one memory block is located between the target memory block and the source memory block.

Referring to FIG. 17, a word line of the target page may be activated such that the data transferred to the bit lines of the target memory block BLKa2 may be written into the target page (step S241).

However, in the case where the target memory block BLKa2 is not adjacent to the source memory block BLKa5, voltages of the bit lines of the source memory block BLKa5, which are set to one of the supply voltage and the ground voltage based on the data stored in the source page, may be changed a little while transferring the voltages from the bit lines of the source memory block BLKa5 to the bit lines of the target memory block BLKa2 by turning on the fourth isolation transistor ISOT4 (step S238) as illustrated in FIG. 16. For example, when a bit line of the source memory block BLKa5 is at the supply voltage, the voltage transferred to a bit line of the target memory block BLKa2 may be a little lower than the supply voltage, and when a bit line of the source memory block BLKa5 is at the ground voltage, the voltage transferred to a bit line of the target memory block BLKa2 may be a little higher than the ground voltage. Therefore, to copy data from the source page to the target page correctly, voltages of the bit lines of the target memory block BLKa2 may be amplified after voltages of the bit lines of the source memory block BLKa5 are transferred to the bit lines of the target memory block BLKa2, and then the amplified voltages may be written again into the target page.

Figure 18:
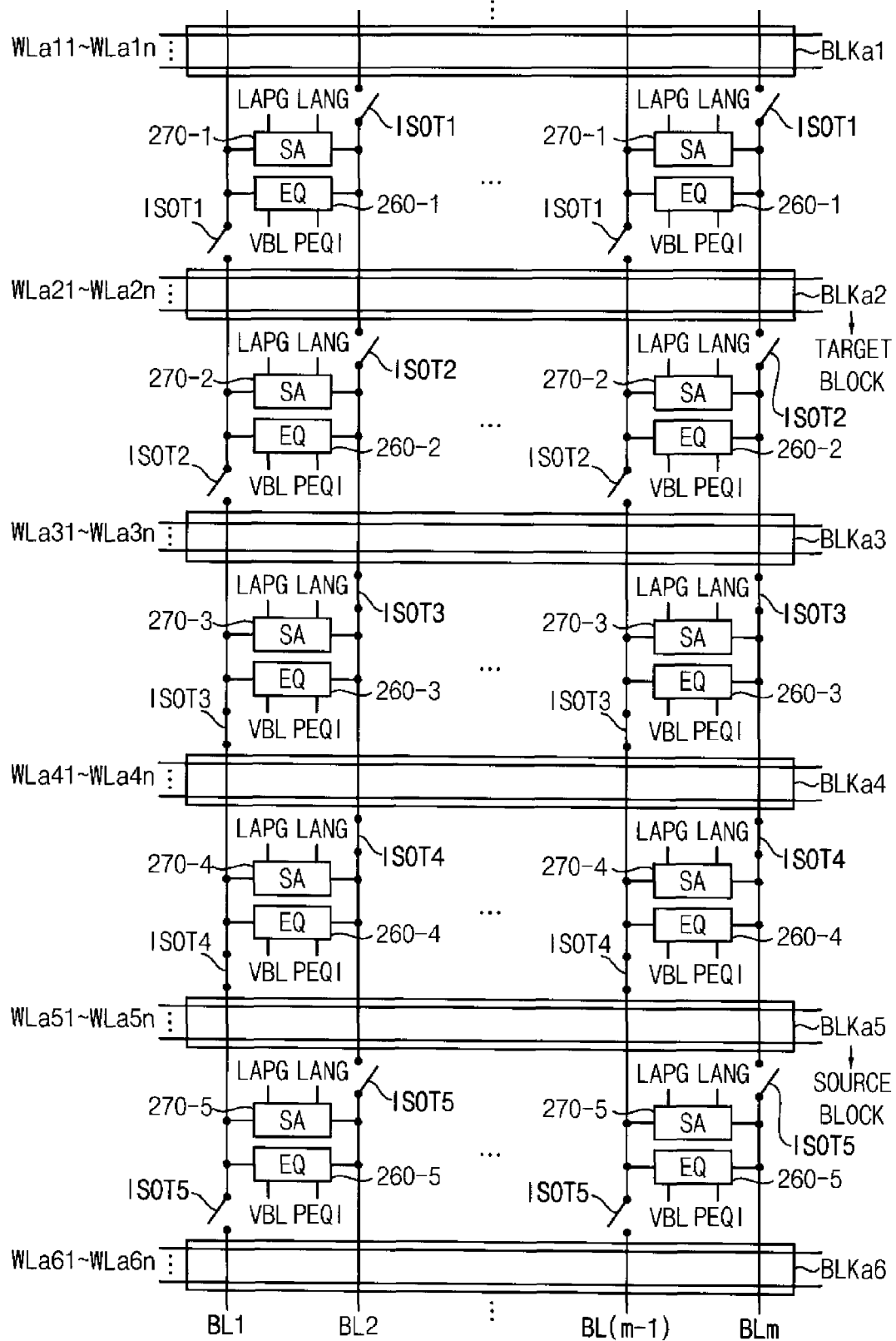

For example, as illustrated in FIG. 18, the second isolation transistor ISOT2 may be turned off such that the bit lines of the target memory block BLKa2 may be disconnected from bit lines of a memory block BLKa3 adjacent to the target memory block BLKa2 in a direction of the source memory block BLKa5 (step S242), the third and fourth equalizers 260-3 and 260-4 may be turned on such that bit lines of memory blocks BLKa4, which are located between the target memory block BLKa2 and the source memory block BLKa5 and are not adjacent to the target memory block BLKa2, and bit lines of the source memory block BLKa5 may be precharged to the precharge voltage VBL (step S243). Therefore, even bit lines BL(2k) to which the second sense amplifier 270-2 is coupled may be precharged to the precharge voltage VBL. In this step, if the second equalizer 260-2 is also turned on, the data transferred to odd bit lines BL(2k−1) of the target memory block BLKa2 may be destroyed. Therefore, bit lines of a memory block BLKa3 adjacent to the target memory block BLKa2 in a direction of the source memory block BLKa5 should not be precharged.

Since odd bit lines BL(2k−1) to which the first sense amplifier 270-1 is coupled may be in an initial state of having the precharge voltage VBL, the sense amplifiers 270-1 and 270-2 of the target memory block BLKa2 may be activated to amplify voltages of the bit lines of the target memory block BLKa2 (step S244). For example, the second sense amplifier 270-2 may amplify voltages of odd bit lines BL(2k−1) of the target memory block BLKa2, and the first sense amplifier 270-1 may amplify voltages of even bit lines BL(2k) of the target memory block BLKa2.

After that, the word line of the target page may be activated again such that the amplified voltages of the bit lines of the target memory block BLKa2 may be written into the target page (step S245). As such, the data transferred from the bit lines of the source memory block BLKa5 to the bit lines of the target memory block BLKa2 may be written into the target page correctly.

After writing the data transferred to the bit lines of the target memory block BLKa2 into the target page, bit lines of a memory block BLKa3 adjacent to the target memory block BLKa2 in a direction of the source memory block BLKa5 and the bit lines of the target memory block BLKa2 may be precharged to the precharge voltage VBL, and the isolation transistors ISOT1, ISOT2, ISOT3, ISOT4 and ISOT5 may be turned on to connect between bit lines of adjacent memory blocks such that the memory device 200a may be in the initial state as illustrated in FIG. 12.

Through the steps described above, the memory device 200a may internally perform the page copy operation in the case where at least one memory block is located between the target memory block and the source memory block.

In general memory systems, a memory controller reads data stored in a source page of a memory device and then writes the data into a target page of the memory device to copy the data from the source page to the target page. Such a procedure may require storing the read data in a buffer, for example, that may be located external to the memory device.

However, as described above, in the memory system 30 according to example embodiments, the memory device 200a may perform the page copy operation internally such that power consumption may decrease and operation speed may increase.

In some example embodiments, the memory device 200a may finish the page copy operation in a predetermined time interval from a time at which the memory device 200a receives the page copy command PCC, the source address SADDR and the target address TADDR from the memory controller 100.

Figure 19:
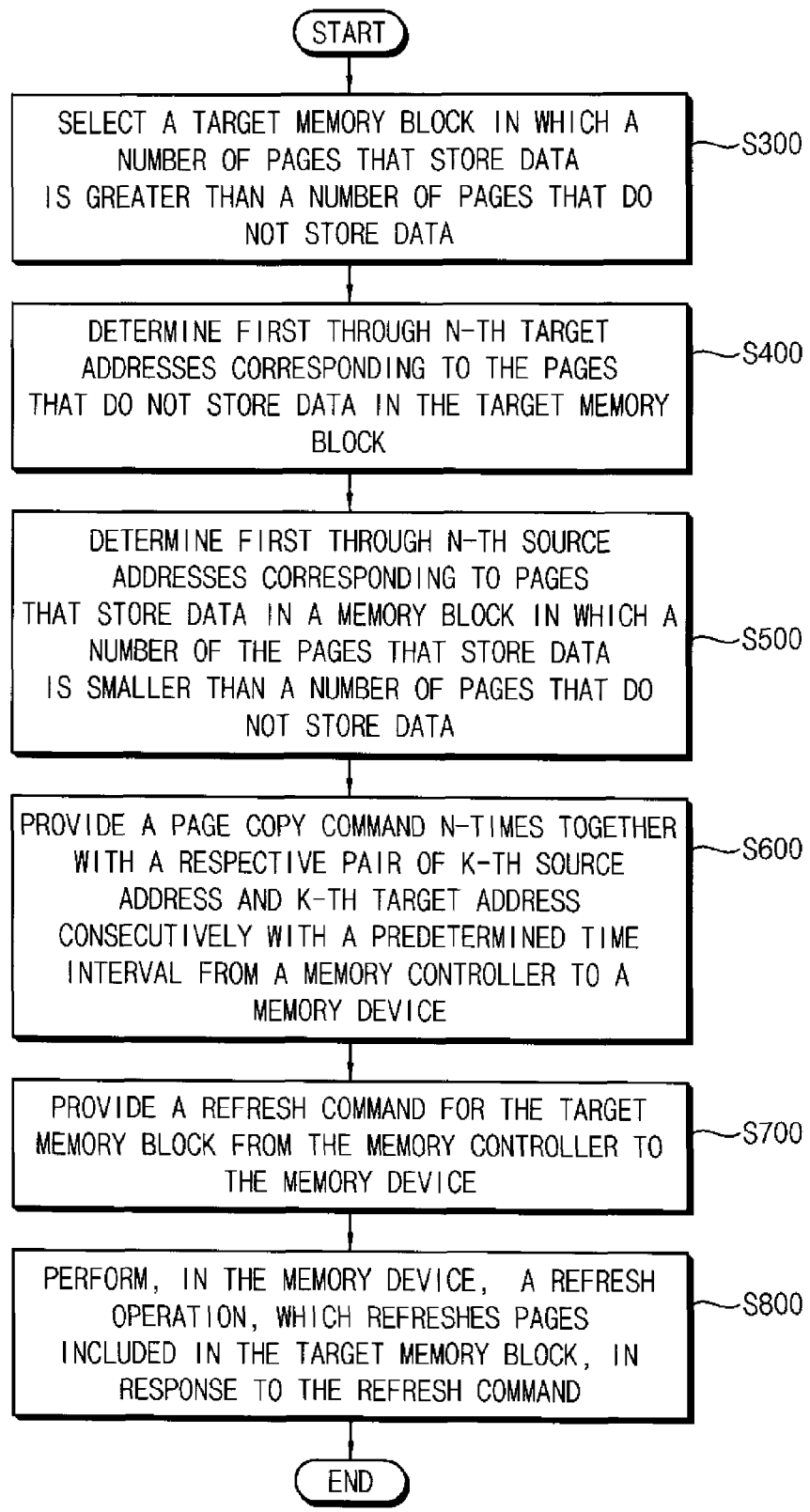
FIG. 19 is a flow chart illustrating a method of managing pages in a memory system according to other example embodiments.

FIG. 19 is a flow chart illustrating a method of managing pages in a memory system according to other example embodiments.

Referring to FIG. 19, in a method of managing pages in the memory system 30 according to other example embodiments, the memory controller 100 may select a memory block among the plurality of memory blocks included in the memory cell array 250 in which a number of pages that store data is greater than a number of pages that do not store data as the target memory block (step S300), and determine first through p-th target addresses TADDR corresponding to the pages that do not store data in the target memory block (step S400). Here, p represents a positive integer. In addition, the memory controller 100 may select a memory block among the plurality of memory blocks included in the memory cell array 250 in which a number of pages that store data is smaller than a number of pages that do not store data as the source memory block and determine first through p-th source addresses SADDR corresponding to the pages that store data in the source memory block (step S500).

The memory controller may provide the page copy command PCC p-times together with a respective pair of q-th source address and q-th target address consecutively in accordance with the predetermined time interval to the memory device 200a (step S600). Here, q represents a positive integer smaller than or equal to p. The memory device 200a may consecutively perform the page copy operation in response to the page copy command PCC consecutively received from the memory controller 100. Therefore, data distributed among the plurality of memory blocks may be moved to the target memory block.

The memory controller 100 may provide a refresh command for the target memory block to the memory device 200a (step S700), and the memory device 200a may perform a refresh operation, which refreshes pages included in the target memory block, in response to the refresh command (step S800).

As described above, the memory controller 100 may effectively concentrate data, which are distributed among the plurality of memory blocks, in some memory blocks by moving data stored in a memory block having a relatively low density of data to a memory block having a relatively high density of data using the method of copying a page in the memory device 200a. Since only memory blocks storing data require to be refreshed, a number of memory blocks that need to be refreshed may be reduced in the memory system 30. As such, the memory system 30 according to example embodiments may increase a bandwidth of a command bus in a normal operation mode and decrease a power consumption in a self-refresh mode.

Figure 20:
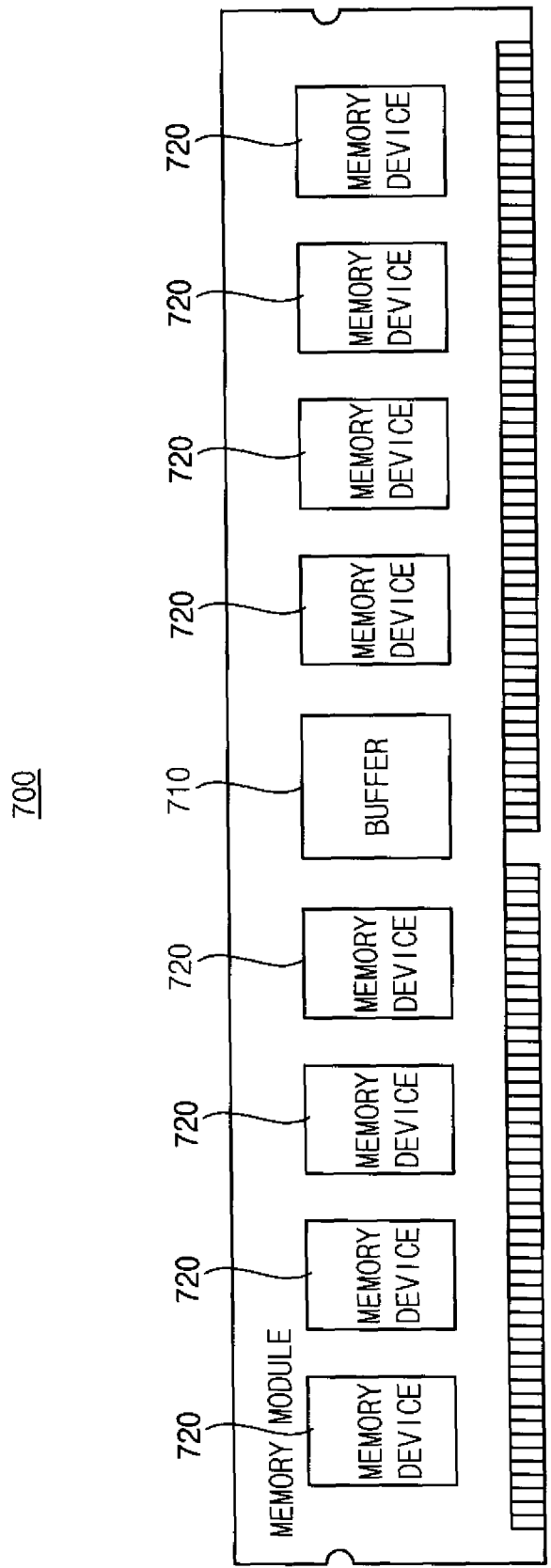
FIG. 20 is a block diagram illustrating a memory module according to exemplary embodiments.

FIG. 20 is a block diagram illustrating a memory module according to exemplary embodiments.

Referring to FIG. 20, a memory module 700 may include a plurality of memory devices 720. In some embodiments, the memory module 700 may be an unbuffered dual in-line memory module (UDIMM), a registered dual in-line memory module (RDIMM), a fully buffered dual in-line memory module (FBDIMM), a load reduced dual in-line memory module LRDIMM, etc.

The memory module 700 may further include a buffer 710 that receives a command signal, an address signal and data from a memory controller through a plurality of transmission lines and buffers the command signal, the address signal and the data to provide the plurality of memory devices 720 with the command signal, the address signal and the data.

In some example embodiments, data transmission lines between the buffer 710 and the plurality of memory devices 720 may be coupled in a point-to-point topology. Command transmission lines and address transmission lines between the buffer 710 and the plurality of memory devices 720 may be coupled in a multi-drop topology, a daisy-chain topology, a fly-by daisy-chain topology, or the like. Since the buffer 710 buffers the command signal, the address signal and the data, the memory controller may interface with the memory module 700 by driving only a load of the buffer 710. Accordingly, the memory module 700 may include more memory devices 720 and/or more memory ranks, and a memory system may include more memory modules 700.

The memory device 720 may include a memory cell array having a plurality of memory blocks. Each of the memory blocks may include a plurality of pages. The memory device 720 may receive a page copy command, a source address and a target address from the memory controller and perform a page copy operation, which copies data stored in a source page corresponding to the source address to a target page corresponding to the target address through bit lines of a source memory block including the source page and bit lines of a target memory block including the target page, in response to the page copy command. Therefore, the memory controller may not need to read data stored in the source page of the memory device 720 and then write the data into the target page of the memory device 720 to copy the data from the source page to the target page. Instead, the memory device 720 may perform the page copy operation internally such that power consumption may decrease and operation speed may increase. The memory device 720 may be embodied, for example as the memory device 200a of FIG. 3. An exemplary structure and an operation of the memory device 200a are described above with reference to FIGS. 1 to 19. Therefore, a detail description of the memory device 720 will be omitted.

Figure 21:
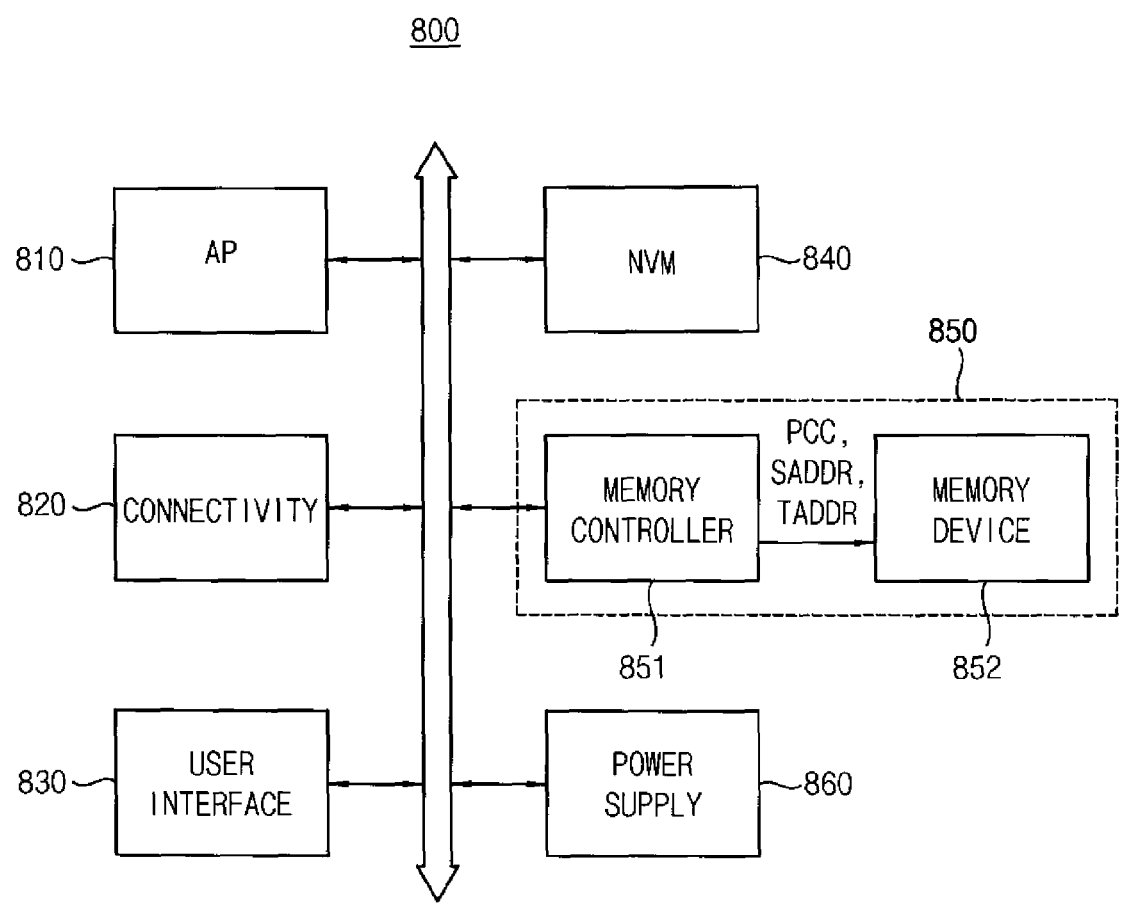
FIG. 21 is a block diagram illustrating a mobile system according to exemplary embodiments.

FIG. 21 is a block diagram illustrating a mobile system according to exemplary embodiments.

Referring to FIG. 21, a mobile system 800 includes an application processor 810, a connectivity unit 820, a user interface 830, a nonvolatile memory device NVM 840, a memory system 850 and a power supply 860. In some embodiments, the mobile system 800 may be a mobile phone, a smart phone, a personal digital assistant (PDA), a portable multimedia player (PMP), a digital camera, a music player, a portable game console, a navigation system, etc.

The application processor 810 may execute applications, such as a web browser, a game application, a video player, etc. In some embodiments, the application processor 810 may include a single core or multiple cores. For example, the application processor 810 may be a multi-core processor, such as a dual-core processor, a quad-core processor, a hexa-core processor, etc. The application processor 810 may include an internal or external cache memory.

The connectivity unit 820 may perform wired or wireless communication with an external device. For example, the connectivity unit 820 may perform Ethernet communication, near field communication (NFC), radio frequency identification (RFID) communication, mobile telecommunication, memory card communication, universal serial bus (USB) communication, etc. In some embodiments, connectivity unit 820 may include a baseband chipset that supports communications, such as global system for mobile communications (GSM), general packet radio service (GPRS), wideband code division multiple access (WCDMA), high speed downlink/uplink packet access (HSxPA), etc.

The memory system 850 may include a memory controller 851 and a memory device 852. The memory device 852 may store data processed by the application processor 810, or may operate as a working memory. The memory device 852 may include a memory cell array having a plurality of memory blocks. Each of the memory blocks may include a plurality of pages. The memory device 852 may receive a page copy command PCC, a source address SADDR and a target address TADDR from the memory controller 851 and perform a page copy operation, which copies data stored in a source page corresponding to the source address SADDR to a target page corresponding to the target address TADDR through bit lines of a source memory block including the source page and bit lines of a target memory block including the target page, in response to the page copy command PCC. Therefore, the memory controller 851 may not need to read data stored in the source page of the memory device 852 and then write the data into the target page of the memory device 852 to copy the data from the source page to the target page. Instead, the memory device 852 may perform the page copy operation internally such that power consumption may decrease and operation speed may increase. The memory system 850 may be embodied, for example, as the memory system 30 of FIG. 2. An exemplary structure and an operation of the memory system 30 are described above with reference to FIGS. 1 to 19. Therefore, a detail description of the memory system 850 will be omitted.

The nonvolatile memory device 840 may store a boot image for booting the mobile system 800. For example, the nonvolatile memory device 840 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The user interface 830 may include at least one input device, such as a keypad, a touch screen, etc., and at least one output device, such as a speaker, a display device, etc. The power supply 860 may supply a power supply voltage to the mobile system 800.

In some embodiments, the mobile system 800 may further include an image processor, and/or a storage device, such as a memory card, a solid state drive (SSD), a hard disk drive (HDD), a CD-ROM, etc.

In some embodiments, the mobile system 800 and/or components of the mobile system 800 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 22:
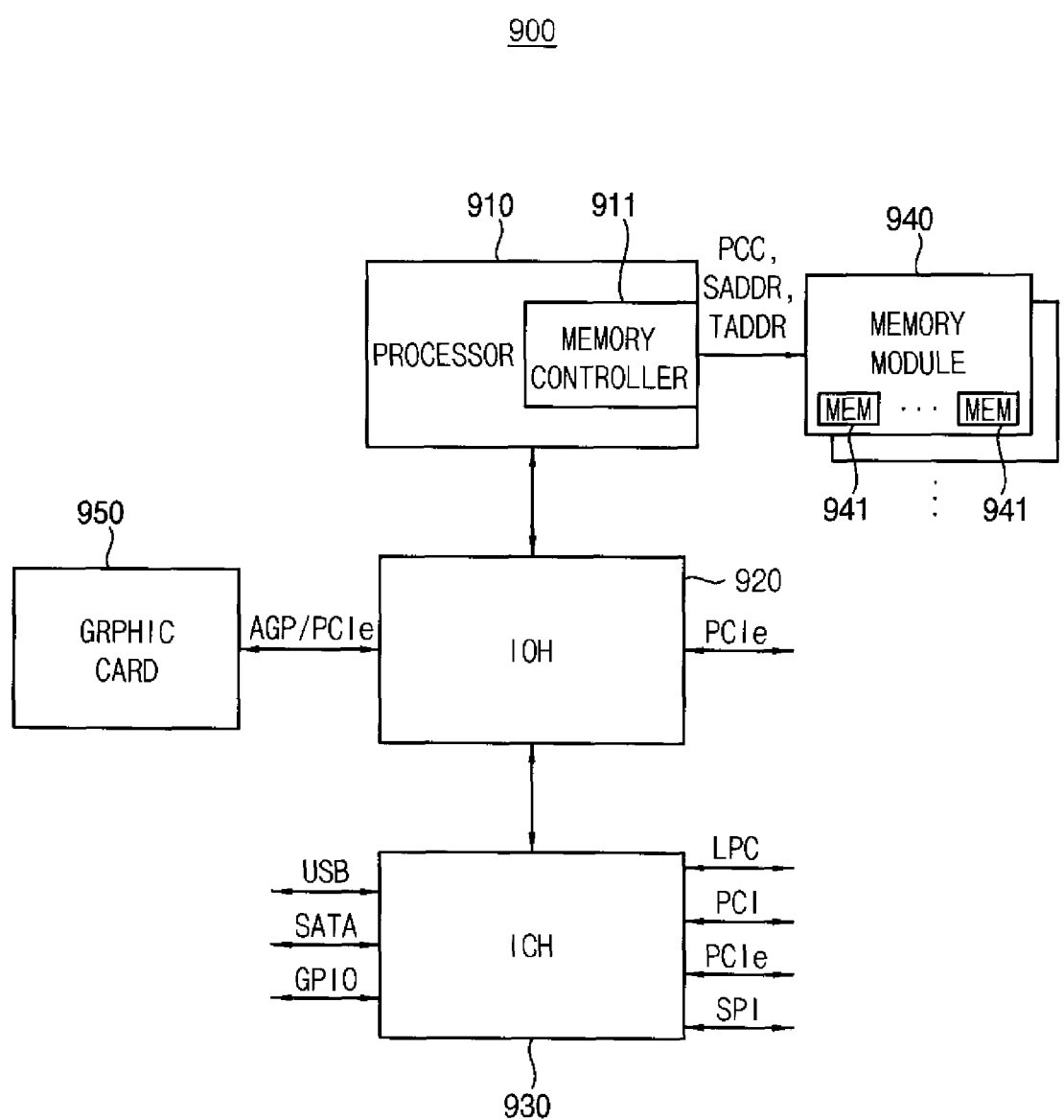
FIG. 22 is a block diagram illustrating a computing system according to exemplary embodiments.

FIG. 22 is a block diagram illustrating a computing system according to exemplary embodiments.

Referring to FIG. 22, a computing system 900 includes a processor 910, an input/output hub (IOH) 920, an input/output controller hub (ICH) 930, at least one memory module 940 and a graphics card 950. In some embodiments, the computing system 900 may be a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc.

The processor 910 may perform various computing functions, such as executing specific software for performing specific calculations or tasks. For example, the processor 910 may be a microprocessor, a central process unit (CPU), a digital signal processor, or the like. In some embodiments, the processor 910 may include a single core or multiple cores. For example, the processor 910 may be a multi-core processor, such as a dual-core processor, a quad-core processor, a hexa-core processor, etc. Although FIG. 22 illustrates the computing system 900 including one processor 910, in some embodiments, the computing system 900 may include a plurality of processors.

The processor 910 may include a memory controller 911 for controlling operations of the memory module 940. The memory controller 911 included in the processor 910 may be referred to as an integrated memory controller (IMC). A memory interface between the memory controller 911 and the memory module 940 may be implemented with a single channel including a plurality of signal lines, or may bay be implemented with multiple channels, to each of which at least one memory module 940 may be coupled. In some embodiments, the memory controller 911 may be located inside the input/output hub 920. The input/output hub 920 including the memory controller 911 may be referred to as memory controller hub (MCH).

The memory module 940 may include a plurality of memory devices MEM 941 that store data provided from the memory controller 911. The memory device 941 may include a memory cell array having a plurality of memory blocks. Each of the memory blocks may include a plurality of pages. The memory device 941 may receive a page copy command PCC, a source address SADDR and a target address TADDR from the memory controller 911 and perform a page copy operation, which copies data stored in a source page corresponding to the source address SADDR to a target page corresponding to the target address TADDR through bit lines of a source memory block including the source page and bit lines of a target memory block including the target page, in response to the page copy command PCC. Therefore, the memory controller 911 may not need to read data stored in the source page of the memory device 941 and then write the data into the target page of the memory device 941 to copy the data from the source page to the target page. Instead, the memory device 941 may perform the page copy operation internally such that power consumption may decrease and operation speed may increase. The memory system including the memory controller 911 and the memory device 941 may be embodied, for example, as the memory system 30 of FIG. 2. An exemplary structure and an operation of the memory system 30 are described above with reference to FIGS. 1 to 19. Therefore, a detail description of the memory controller 911 and the memory device 941 will be omitted.

The input/output hub 920 may manage data transfer between processor 910 and devices, such as the graphics card 950. The input/output hub 920 may be coupled to the processor 910 via various interfaces. For example, the interface between the processor 910 and the input/output hub 920 may be a front side bus (FSB), a system bus, a HyperTransport, a lightning data transport (LDT), a QuickPath interconnect (QPI), a common system interface (CSI), etc. The input/output hub 920 may provide various interfaces with the devices. For example, the input/output hub 920 may provide an accelerated graphics port (AGP) interface, a peripheral component interface-express (PCIe), a communications streaming architecture (CSA) interface, etc. Although FIG. 22 illustrates the computing system 900 including one input/output hub 920, in some embodiments, the computing system 900 may include a plurality of input/output hubs.

The graphics card 950 may be coupled to the input/output hub 920 via AGP or PCIe. The graphics card 950 may control a display device for displaying an image. The graphics card 950 may include an internal processor for processing image data and an internal memory device. In some embodiments, the input/output hub 920 may include an internal graphics device along with or instead of the graphics card 950 outside the graphics card 950. The graphics device included in the input/output hub 920 may be referred to as integrated graphics. Further, the input/output hub 920 including the internal memory controller and the internal graphics device may be referred to as a graphics and memory controller hub (GMCH).

The input/output controller hub 930 may perform data buffering and interface arbitration to efficiently operate various system interfaces. The input/output controller hub 930 may be coupled to the input/output hub 920 via an internal bus, such as a direct media interface (DMI), a hub interface, an enterprise Southbridge interface (ESI), PCIe, etc.

The input/output controller hub 930 may provide various interfaces with peripheral devices. For example, the input/output controller hub 930 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 910, the input/output hub 920 and the input/output controller hub 930 may be implemented as separate chipsets or separate integrated circuits. In other embodiments, at least two of the processor 910, the input/output hub 920 and the input/output controller hub 930 may be implemented as a single chipset.

The foregoing is illustrative of the present inventive concept and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of copying a page in a memory device having a plurality of memory blocks and a plurality of sets of bit lines, each of the plurality of memory blocks including a plurality of pages, and each set of bit lines corresponding to a respective memory block, wherein first bit lines of a source memory block that includes a source page are respectively coupled to second bit lines of a target memory block that includes a target page, the method comprising:
   disconnecting the first bit lines of the source memory block from the second bit lines of the target memory block;
   transferring data stored in the source page to the first bit lines of the source memory block;
   transferring the data from the first bit lines of the source memory block to the second bit lines of the target memory block by connecting the first bit lines of the source memory block to the second bit lines of the target memory block; and
   writing the data transferred to the second bit lines of the target memory block into the target page,
   wherein, in a case that the target memory block is adjacent to the source memory block, transferring the data from the first bit lines of the source memory block to the second bit lines of the target memory block includes:
   disconnecting the second bit lines of the target memory block from bit lines of a memory block adjacent to the target memory block in an opposite direction of the source memory block;
   turning off an equalizer of the target memory block; and
   connecting the first bit lines of the source memory block to the second bit lines of the target memory block.

2. The method of claim 1, wherein disconnecting the first bit lines of the source memory block from the second bit lines of the target memory block includes:
   disconnecting between the first bit lines of the source memory block and bit lines of memory blocks adjacent to the source memory block.

3. The method of claim 1, wherein transferring the data stored in the source page to the first bit lines of the source memory block includes:
   activating a word line of the source page; and
   activating a sense amplifier of the source memory block to amplify voltages of the first bit lines of the source memory block.

4. The method of claim 1, wherein writing the data transferred to the second bit lines of the target memory block into the target page includes:
   activating a word line of the target page.

5. The method of claim 4, further comprising:
   precharging the first bit lines of the source memory block and the second bit lines of the target memory block after writing the data transferred to the second bit lines of the target memory block into the target page; and
   connecting the second bit lines of the target memory block to the first bit lines of the source memory block and to the bit lines of the memory block adjacent to the target memory block in the opposite direction of the source memory block.

6. A method of copying a page in a memory device having a plurality of memory blocks and a plurality of sets of bit lines, each of the plurality of memory blocks including a plurality of pages, and each set of bit lines corresponding to a respective memory block, wherein first bit lines of a source memory block that includes a source page are respectively coupled to second bit lines of a target memory block that includes a target page, the method comprising:
   disconnecting the first bit lines of the source memory block from the second bit lines of the target memory block;
   transferring data stored in the source page to the first bit lines of the source memory block;
   transferring the data from the first bit lines of the source memory block to the second bit lines of the target memory block by connecting the first bit lines of the source memory block to the second bit lines of the target memory block; and writing the data transferred to the second bit lines of the target memory block into the target page, wherein, in a case that at least one memory block is located between the target memory block and the source memory block, transferring the data from the first bit lines of the source memory block to the second bit lines of the target memory block includes:

disconnecting the second bit lines of the target memory block from bit lines of a memory block adjacent to the target memory block in an opposite direction of the source memory block;

turning off respective equalizers of at least one memory blocks located between the target memory block and the source memory block and an equalizer of the target memory block; and connecting the first bit lines of the source memory block and bit lines of a memory block adjacent to the source memory block and in between the source memory block and the target memory block.

7. The method of claim 6, wherein writing the data transferred to the second bit lines of the target memory block into the target page includes:

activating a word line of the target page;

disconnecting the second bit lines of the target memory block from the bit lines of the memory block adjacent to the target memory block and in between the source memory block and the target memory block;

precharging bit lines of memory blocks, which are located between the target memory block and the source memory block and are not adjacent to the target memory block, and precharging the first bit lines of the source memory block;

activating a sense amplifier of the target memory block to amplify voltages of the second bit lines of the target memory block; and activating the word line of the target page.

8. The method of claim 7, further comprising:

precharging the second bit lines of the target memory block and the bit lines of the memory block adjacent to the target memory block and in between the source memory block and the target memory block after writing the data transferred to the second bit lines of the target memory block into the target page; and connecting between bit lines of adjacent memory blocks.

9. The method of claim 1, further comprising:

precharging bit lines of the plurality of memory blocks and connecting between bit lines of adjacent memory blocks before disconnecting between the first bit lines of the source memory block and the second bit lines of the target memory block.

10. The method of claim 1, wherein a connection between bit lines of adjacent memory blocks is controlled by an isolation transistor that turns on in response to an isolation control signal.

11. A method of copying a page in a memory device having a plurality of memory blocks and a plurality of sets of bit lines, each of the plurality of memory blocks including a plurality of pages, and each set of bit lines corresponding to a respective memory block, wherein first bit lines of a source memory block that includes a source page are respectively coupled to second bit lines of a target memory block that includes a target page, the method comprising:

disconnecting the first bit lines of the source memory block from the second bit lines of the target memory block;

transferring data stored in the source page of the source memory block to the first bit lines of the source memory block while the first bit lines are disconnected from the second bit lines;

subsequently connecting the first bit lines of the source memory block to the second bit lines of the target memory block;

transferring the data from the first bit lines of the source memory block to the second bit lines of the target memory block; and writing the data transferred to the second bit lines of the target memory block into the target page.

12. The method of claim 11, wherein disconnecting the first bit lines of the source memory block from the second bit lines of the target memory block includes:

disconnecting between the first bit lines of the source memory block and bit lines of memory blocks adjacent to the source memory block.

13. The method of claim 11, wherein transferring the data stored in the source page to the first bit lines of the source memory block includes:

activating a word line of the source page; and activating a sense amplifier of the source memory block to amplify voltages of the first bit lines of the source memory block.

14. The method of claim 11, further comprising:

disconnecting the second bit lines of the target memory block from bit lines of a memory block adjacent to the target memory block in an opposite direction of the source memory block; and turning off an equalizer of the target memory block.

15. The method of claim 14, wherein writing the data transferred to the second bit lines of the target memory block into the target page includes:

activating a word line of the target page.

16. The method of claim 15, further comprising:

precharging the first bit lines of the source memory block and the second bit lines of the target memory block after writing the data transferred to the second bit lines of the target memory block into the target page; and connecting the second bit lines of the target memory block to the first bit lines of the source memory block and to the bit lines of the memory block adjacent to the target memory block in the opposite direction of the source memory block.

17. The method of claim 11, further comprising:

disconnecting the second bit lines of the target memory block from bit lines of a memory block adjacent to the target memory block in an opposite direction of the source memory block; and turning off respective equalizers of at least one memory block located between the target memory block and the source memory block and an equalizer of the target memory block; and connecting the first bit lines of the source memory block and bit lines of a memory block adjacent to the source memory block and in between the source memory block and the target memory block such that the first bit lines of the source memory block are connected to the second bit lines of the target memory block.

18. The method of claim 17, wherein writing the data transferred to the second bit lines of the target memory block into the target page includes:

activating a word line of the target page;

disconnecting the second bit lines of the target memory block from the bit lines of the memory block adjacent to the target memory block and in between the source memory block and the target memory block;

precharging bit lines of memory blocks, which are located between the target memory block and the source memory block and are not adjacent to the target memory block, and precharging the first bit lines of the source memory block;

activating a sense amplifier of the target memory block to amplify voltages of the second bit lines of the target memory block; and activating the word line of the target page.

19. The method of claim 18, further comprising:

precharging the second bit lines of the target memory block and the bit lines of the memory block adjacent to the target memory block and in between the source memory block and the target memory block after writing the data transferred to the second bit lines of the target memory block into the target page; and connecting between bit lines of adjacent memory blocks.

* * * * *